US007327667B2

(12) United States Patent
Thornton et al.

(10) Patent No.: US 7,327,667 B2
(45) Date of Patent: Feb. 5, 2008

(54) SEMICONDUCTOR LASER AND ASSOCIATED DRIVE CIRCUIT SUBSTRATE

(75) Inventors: Robert L. Thornton, Los Altos, CA (US); Douglas G. Stinson, Fremont, CA (US); Roger K. Malmhall, Mountain View, CA (US); Matthew C. Bashaw, Palo Alto, CA (US)

(73) Assignee: Research Investment Network, Inc., Long Beach, CA (US)

( * ) Notice: Subject to any disclaimer, the term of this patent is extended or adjusted under 35 U.S.C. 154(b) by 338 days.

(21) Appl. No.: 10/711,527

(22) Filed: Sep. 23, 2004

(65) Prior Publication Data

US 2005/0025207 A1 Feb. 3, 2005

Related U.S. Application Data

(60) Division of application No. 10/441,429, filed on May 19, 2003, now Pat. No. 6,937,637, which is a continuation of application No. 10/131,676, filed on Apr. 23, 2002, now abandoned, which is a continuation of application No. 09/495,636, filed on Feb. 1, 2000, now abandoned.

(51) Int. Cl.
*G11B 7/125* (2006.01)
(52) U.S. Cl. .................................... 369/300
(58) Field of Classification Search ............... 369/300, 369/44.12, 44.23, 112, 116, 121, 112.23, 369/13.23, 275.4, 13.25, 13.32, 13.33; 427/586; 720/659; 257/91; 372/50.121
See application file for complete search history.

(56) References Cited

U.S. PATENT DOCUMENTS

| 5,068,870 | A | * | 11/1991 | Yagi et al. ............. 372/50.121 |
| 5,199,090 | A | * | 3/1993 | Bell ............................ 385/33 |
| 5,481,386 | A | * | 1/1996 | Shimano et al. ......... 369/44.12 |
| 5,625,617 | A | | 4/1997 | Hopkins et al. ............ 369/121 |
| 5,917,848 | A | | 6/1999 | Claisse et al. ................ 372/96 |
| 6,009,064 | A | | 12/1999 | Hajjar ........................ 369/112 |
| 6,115,353 | A | * | 9/2000 | Horie et al. ............. 369/275.4 |
| 6,177,150 | B1 | * | 1/2001 | Fujita et al. ................ 427/586 |
| 6,185,177 | B1 | * | 2/2001 | Shimano et al. ............ 369/300 |
| 6,429,461 | B1 | * | 8/2002 | Tanaka et al. ................ 257/91 |
| 6,657,927 | B1 | * | 12/2003 | Awano et al. ............ 369/13.23 |
| 6,807,131 | B1 | * | 10/2004 | Hesselink et al. ....... 369/13.13 |
| 6,963,530 | B1 | * | 11/2005 | Thornton et al. ........... 369/121 |
| 7,057,998 | B1 | * | 6/2006 | Oumi et al. ........... 369/112.23 |
| 7,069,569 | B2 | * | 6/2006 | Thornton et al. ........... 720/659 |
| 7,158,470 | B2 | * | 1/2007 | Thornton et al. ........... 369/121 |

FOREIGN PATENT DOCUMENTS

WO WO9959149 * 11/1999

* cited by examiner

*Primary Examiner*—Tianjie Chen
(74) *Attorney, Agent, or Firm*—Steve A. Wong; Caroline T. Do

(57) ABSTRACT

A single monolithic semiconductor substrate comprises a first side and a second side. The first side includes an air bearing surface. A laser integrates with the first side. The laser has an emission facet substantially co-planer with the air bearing surface. A contact pad on the second side electronically bridges to the laser.

12 Claims, 21 Drawing Sheets

SEMICONDUCTOR LASER AND ASSOCIATED DRIVE CIRCUIT SUBSTRATE

CROSS REFERENCE TO RELATED APPLICATION

This application is a divisional of Ser. No. 10/441,429, filed May 19, 2003, now U.S. Pat. No. 6,937,637 which is a continuation of U.S. patent application Ser. No. 10/131, 676, filed Apr. 23, 2002, now abandoned, which is a continuation of U.S. patent application Ser. No. 09/495,636, filed Feb. 1, 2000, now abandoned.

BACKGROUND OF THE INVENTION

1. Field of the Invention

This invention pertains generally to optical head devices, systems and methods for reading optical media, and more particularly to a near-field optical system and method wherein one or more semiconductor lasers and a slider are made and used as a single, integrated monolithic device.

2. Description of the Background Art

The optical head of an optical read/write system can operate as a "flying head" wherein the optical head does not contact the adjacent optical medium, but is positioned close to the optical medium and separated by an air gap. The optical head includes an aerodynamically designed slider with an air bearing surface for maintaining an air cushion between the optical head and the optical medium. One or more solid state lasers are mounted on the slider and are positioned to read and/or write onto the optical medium. The slider is typically mounted on a read arm by a spring mechanism, with the bias of the spring mechanism and the aerodynamic shape of the slider determining the distance between the optical head and optical medium.

Conventionally, the solid state laser and slider are separate components made of different materials. The slider, for example, may comprise a metallized SiC or TiC/Al$_2$O$_3$ body which has been appropriately shaped for aerodynamic properties. A solid state laser or lasers are mechanically attached to the slider subsequent to its fabrication. An exemplary prior art attachment process involves careful positioning of the slider on an optical flat, applying a suitable quantity of adhesive or solder to the appropriate locations on the slider, and then urging the laser or lasers along the optical flat into position using micropositioners or microtranslation apparatus. This procedure is generally carried out under an optical microscope. When the adhesive cures, the emission face of the laser should be essentially flush with the slider air-bearing surface.

The above mechanical attachment procedure is difficult and time-intensive. The machining and mechanical alignment tolerances for such mechanical attachment are high, generally on the order of 15 nanometers. Improper attachment of the laser and slider cannot generally be corrected. The preparation of optical heads in this manner has thus involved considerable expense.

There is accordingly a need for an optical head apparatus and method which avoids complex, difficult and expensive mechanical attachment procedures for securing solid state lasers to a slider. The present invention satisfies this need, as well as others, and generally overcomes the deficiencies found in the background art.

SUMMARY OF THE INVENTION

The invention comprises an integrated solid state laser and slider apparatus wherein one or more solid state lasers and an aerodynamically shaped slider comprise a single integrated, monolithic device fabricated from the same base semiconductor material into an optical head. The monolithic optical head can be quickly and easily attached to the read arm of an optical read/write device without requiring attachment of separate laser elements, and without micropositioning or use of optical microscopy for positioning the lasers.

In general terms, the invention comprises an optical head comprising a single semiconductor substrate including a first region which defines a slider having an air bearing surface, and at least one second, laser region which defines a semiconductor laser, with the semiconductor laser having an emission face which is substantially co-planar with the air bearing surface.

By way of example, and not necessarily of limitation, the semiconductor substrate preferably comprises a first conductivity-type clad layer or reflective layer, a second conductivity-type clad layer or reflective layer, an active region positioned between the first conductivity-type clad layer and second conductivity-type clad layer, and a base or substrate layer of first conductivity-type semiconductor material.

More specifically, the first conductivity-type base layer preferably comprises a layer of n-semiconductor material, while the first conductivity-type clad layer is an n-clad layer, and the second conductivity-type-clad layer is a p-clad layer. The p-clad layer or reflective layer is adjacent a first side of the active region, and the n-clad layer or reflective layer adjacent a second side of the active layer. The semiconductor substrate is formed or grown by conventional techniques such that the n-clad layer is deposited on the n-semiconductor baser layer, the active region is deposited on the n-clad layer, and the p-clad layer is deposited on the active region.

A first region of the semiconductor substrate comprises a slider region and includes an air bearing surface, adjacent the p-clad layer, which is aerodynamically structured and configured to define a slider. A second region or regions of the semiconductor substrate comprises a laser region, and includes a p-electrical contact adjacent to the p-clad layer and proximate to the emission face, and an n-electrical contact adjacent to the n-clad layer. The p-side and n-side electrical contacts define generally the laser diode. The optical mode of the laser may additionally, or alternatively, be defined by oxidized or ion-implanted regions associated with the p-clad layer or n-clad layer, as is well known in the art.

In one preferred embodiment of the invention, the active layer in the semiconductor substrate comprises a plurality of quantum well and quantum barrier structures. The p-clad layer preferably comprises a p-doped set of distributed Bragg reflector or DBR mirrors adjacent a first, upper surface of the active layer, and the n-clad layer preferably comprises an n-doped set of DBR mirrors adjacent a second, lower surface of the active layer. The p-doped DBR mirror set preferably comprises a plurality of p-doped, quarter wave dielectric layer pairs, and the n-doped DBR mirror set preferably comprises a plurality of n-doped quarter wave dielectric layer pairs. A p-doped semiconductor layer may be included between the quantum well active layer and the p-doped DBR mirror set, and an n-doped semiconductor layer may be included between the quantum well active region and the n-doped DBR mirror set. An insulating layer is positioned on a top or outer surface of the p-doped DBR mirror set, and a reflective metal layer is located on a top or outer surface of the insulating layer. The n-doped semiconductor base layer is included adjacent a lower, outer surface of the n-DBR mirror set.

The laser region, in the preferred embodiment, comprises a vertical cavity surface emitting laser having an emission facet which is substantially co-planar with the air bearing surface. The laser region is defined by an oxidized or ion-implanted region in the p-DBR mirror stack, adjacent to the active layer, which defines the optical mode of the laser. A p-side electrical contact and n-side electrical contact also defines the laser region by defining a diode structure. The p-electrical contact is provided as a metal pad proximate to the emission face and in electrical contact with the top surface of the p-DBR mirror set. The configuration of the p-contact also generally defines an emission facet for the laser. The n-side electrical contact is provided as a metal pad positioned in electrical contact with the n-type base semiconductor layer. An aperture is cut or etched through the outermost metal layer at the emission facet to provide for optical output from the emission facet in a narrow beam for near-field use.

The p-side electrical contact is preferably recessed with respect to the emission face of the laser region and air bearing surface of the slider region. Preferably, a conductive pathway or via is associated with the recessed p-side electrical contact which places the p-side contact in electrical communication with the n-side of the bulk semiconductor substrate. In this manner, both the p-side and n-side electrical contacts of the diode laser are accessible from a surface of the optical head which is opposite or remote from the air bearing surface. The outer insulating layer and metal layer, which make up generally the air bearing surface of the slider region and emission facet of the laser region, may cover the p-side electrical contact, or may be absent from the area associated with the p-side electrical contact.

In another preferred embodiment of the invention, the outermost metal layer is omitted from the semiconductor substrate, such that the dielectric layer provides both the air bearing surface of the slider region, and the emission facet of the laser region. The emission facet contains no aperture, and optical output is provided from the entire emission facet for large area illumination.

The invention also provides a method for preparing an optical head which comprises, in general terms, preparing a semiconductor substrate, forming or defining at least one laser region on the semiconductor substrate, and forming or defining a slider region on the semiconductor substrate. More preferably, the preparing of the semiconductor substrate comprises providing a layer of n-semiconductor, depositing an n-clad layer thereon, depositing an active layer on the n-clad layer, depositing a p-clad layer on the active layer, and depositing at least one insulating layer on the p-clad layer. Forming the semiconductor substrate may additionally comprise depositing a metal layer on the insulating layer. The semiconductor substrate is preferably formed via conventional low-cost, high volume semiconductor fabrication methods using metal organic vapor phase epitaxy (MOVPE), liquid phase epitaxy (LPE), molecular beam epitaxy (MBE), or other deposition techniques.

The defining of the laser region is accomplished by depositing a p-side electrical contact on the p-clad layer, and an n-side contact on the n-semiconductor layer, with the p-side contact and n-side contact being structured and configured to define the optical mode of the laser. Preferably, depositing the p-side electrical contact also includes the formation of a p-contact "via" or channel. The p-side contact may be deposited before deposition of the outer insulating and metal layer, or subsequently. The defining of the laser region also preferably comprises the formation of an oxidized or ion-implanted section, associated with the p-clad layer or n-clad layer, which is structured and configured to define a laser diode. Where an outer metal layer is included, the defining of the laser also preferably comprises etching or cutting an aperture through the metal layer on the laser emission facet.

The defining of the slider region is carried out by depositing an air bearing surface outer layer on a portion of the semiconductor substrate, and etching the semiconductor substrate to create an air flow cavity. The air bearing surface layer is positioned such that it is substantially co-planar with the emission face of the diode laser defined in the laser region. The air bearing surface layer on the slider region, and the outermost layer on the emission facet preferably comprise the same layer, such that the laser emission facet and air bearing surface are substantially co-planar. In the embodiment wherein an outer metal layer is included on the dielectric layer and an aperture is cut in the laser emission facet, the air bearing surface layer and outer layer of the emission facet will comprise the outer metal layer. Where the metal layer is omitted, the air bearing surface and emission facet will comprise the dielectric layer.

The semiconductor substrate may alternatively comprise an n-p, rather than a p-n structure, in which case the preparing of the semiconductor substrate would comprise providing a layer of p-semiconductor, depositing an p-clad layer thereon, depositing an active layer on the p-clad layer, depositing a n-clad layer on the active layer, and depositing at least one insulating layer on the n-clad layer.

The optical head of the invention as thus prepared, is a single monolithic device comprising an aerodynamic slider and one or more optimally positioned solid state lasers. The invention thus avoids any complex and time-consuming positioning and attachment of the lasers on the slider, as has been heretofore required with previously used optical heads.

The optical head is utilized in a near-field optical system wherein the monolithic optical head is mounted on a read/write arm via a suspension mechanism, and is used to read and write on optical media. The optical system in accordance with the invention comprises generally a monolithic optical head having a slider and at least one integral laser device, a read/write arm coupled to the monolithic optical head via a suspension mechanism, and an optical medium positioned adjacent to the monolithic optical head. The laser in the optical head preferably includes an aperture in an emission facet which is structured and configured for near-field use, wherein the width w of the aperture is generally of smaller dimension than the output wavelength $\lambda$ of the laser. The reflective read/write surface of the optical medium, during read/write operations, is preferably positioned at an optical path-length 1 from the laser emission facet such that the optical path-length 1 is generally less than or smaller than the output wavelength $\lambda$.

The optical media used with the system of the invention preferably comprise "phase change" media wherein multiple write/read/erase cycles may be carried out. The preferred phase change media comprise GeTeSb materials such as $Ge_{0.2}Te_{0.2}Sb_{0.5}$, $Ge_{0.4}Te_{0.4}Sb_{0.1}$ or the like. In one embodiment, the optical medium comprises a phase change layer positioned between a protective overcoat and a base or substrate. In another embodiment, the optical medium comprises an outer overcoat of diamond-like carbon or like protective material, a first dielectric layer, a phase change layer, a second dielectric layer, a metal layer, a third dielectric layer, and a base or substrate.

The invention further comprises a near-field optical method comprising providing an monolithic optical head having an integral slider and laser, positioning the monolithic optical head adjacent to the optical medium, and irradiating the optical medium with the laser. The irradiating may be carried out to effect writing on the medium, or readout of the medium. Preferably, the laser includes an aperture in its emission facet of width w which is generally of smaller dimension than the output wavelength $\lambda$ of the laser, and the irradiating is carried out with the laser positioned such that the emission facet is positioned at an optical path-length 1 from the reflective read/write surface of the medium, with the optical path-length being generally smaller than the output wavelength $\lambda$.

Further advantages of the invention will be brought out in the following portions of the specification, wherein the detailed description is for the purpose of fully disclosing the preferred embodiment of the invention without placing limitations thereon.

BRIEF DESCRIPTION OF THE DRAWINGS

The present invention will be more fully understood by reference to the following drawings, which are for illustrative purposes only.

DETAILED DESCRIPTION OF THE PREFERRED EMBODIMENTS

Referring more specifically to the drawings, for illustrative purposes the present invention is embodied in the apparatus and method shown generally in FIG. 1 through FIG. 14. It will be appreciated that the apparatus and system may vary as to configuration and as to details of the parts without departing from the basic concepts as disclosed herein. The invention is disclosed generally in terms of use of GaAs and AlGaAs materials and semiconductor lasers in a vertical cavity surface emitting laser (VCSEL) configuration, together with optical media using a phase change layer. However, it will be readily apparent to those skilled in the art that different semiconductor materials and other semiconductor laser configurations, as well as different types of optical media, may be utilized with the invention.

Figure 1:
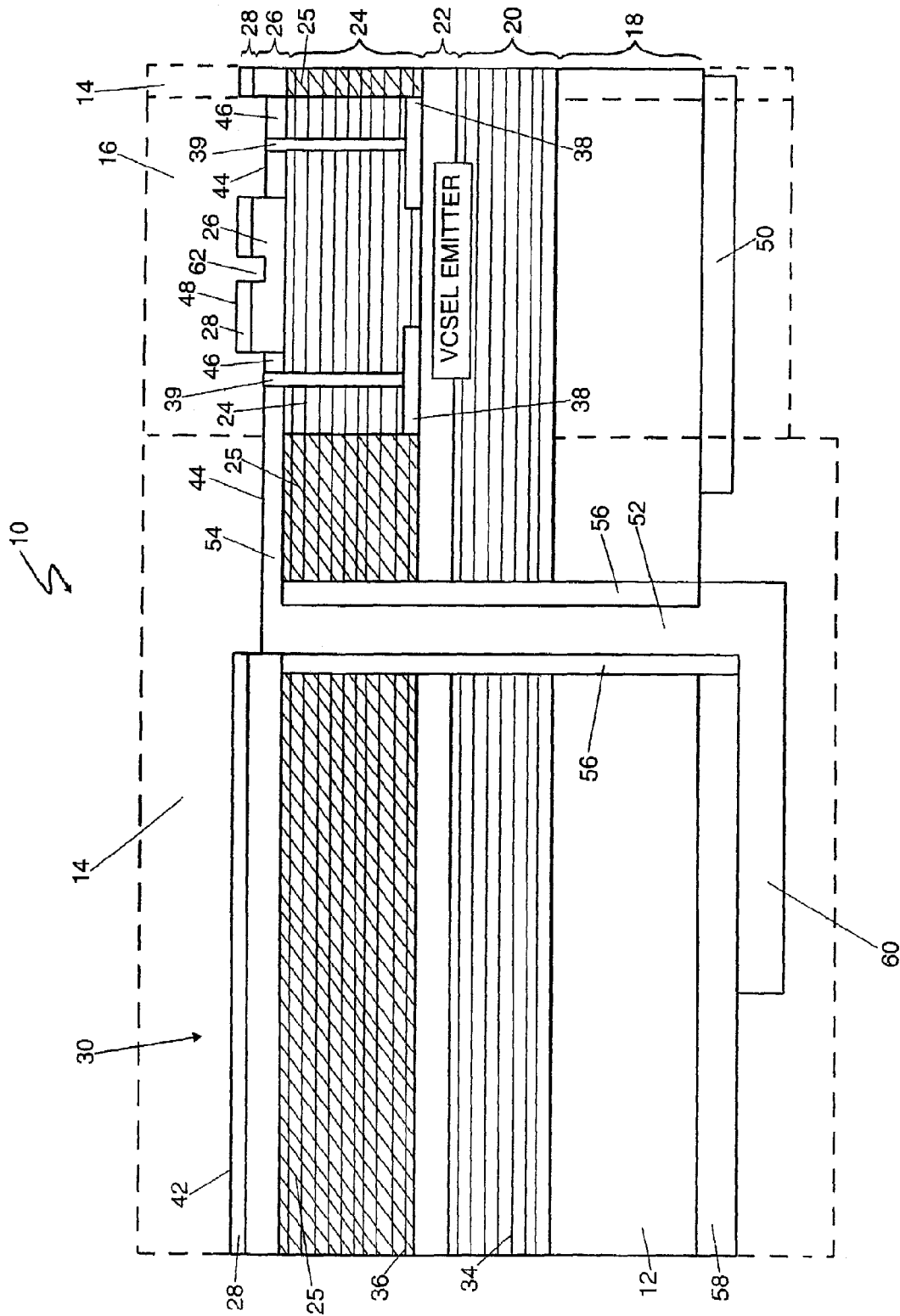
FIG. 1 is a side elevation view in cross-section of a first embodiment optical head apparatus having an integral solid state laser and slider in accordance with the invention.
Figure 2:
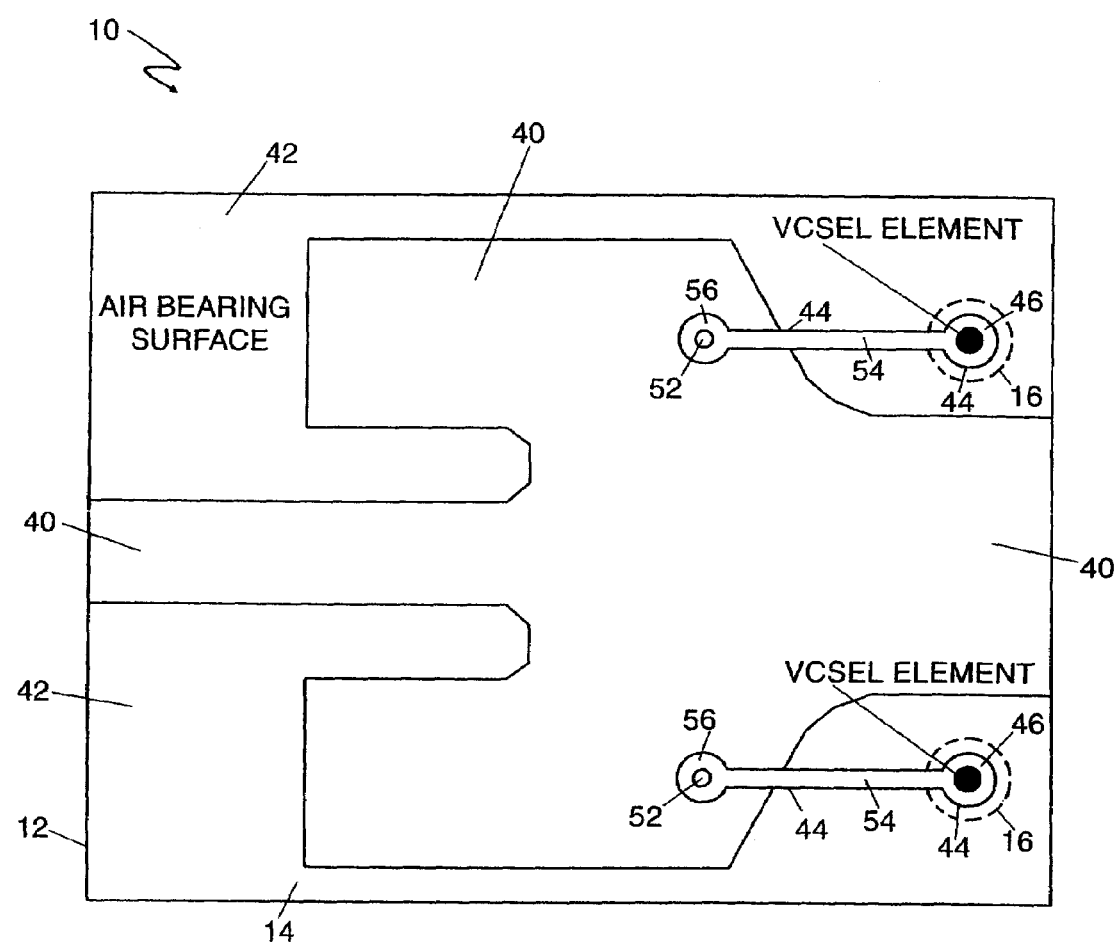
FIG. 2 is a bottom plan view of the optical head apparatus of FIG. 1 showing generally the p-surface of the apparatus with the air bearing surface, air flow cavity, and laser emission facets.
Figure 3:
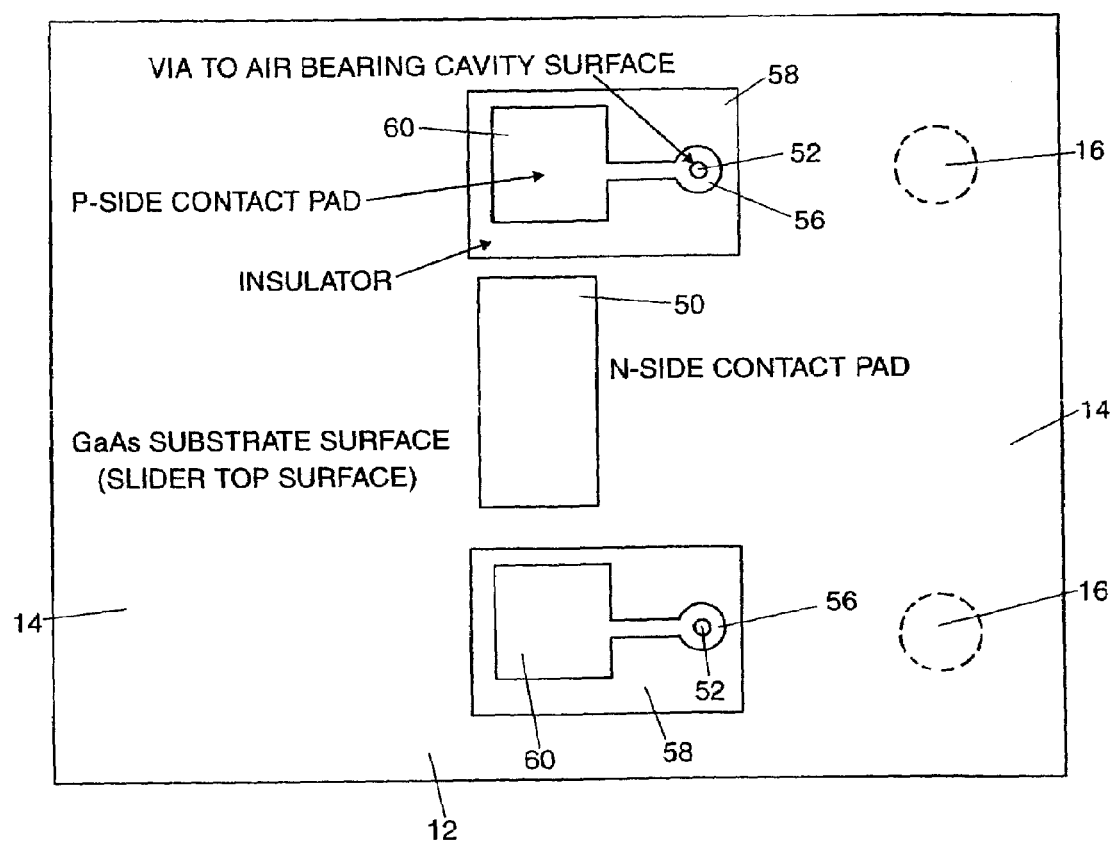
FIG. 3 is a top plan view of the optical head apparatus of FIG. 1 showing generally n-surface of the apparatus showing the n-side contact pads and insulated p-contact pad.

Referring first to FIG. 1 through FIG. 3, there is shown an optical head apparatus 10 in accordance with one presently preferred embodiment of the invention. The optical head apparatus 10 comprises a single, monolithic semiconductor substrate 12 which includes a slider or slider region 14, and one or more lasers or laser regions 16. The optical head apparatus 10 is shown in FIG. 2 with two lasers 14. The cross-sectional view of FIG. 1 is taken through line 1-1 shown in FIG. 2, and, for reasons of clarity, omits portions of the air cavity which are shown in FIG. 2.

The semiconductor substrate 12 preferably comprises an n-doped base semiconductor layer 18, an n-doped lower mirror clad layer 20 adjacent n-semiconductor layer 18, an active region layer 22 adjacent lower mirror n-clad layer 20, and an upper mirror p-doped clad layer 24 adjacent active region layer 22. Semiconductor substrate 12 may alternatively be configured such that base layer 18 and clad layer 20 are p-type, while clad layer 24 is n-type. In one presently preferred embodiment, clad layer 24 is selectively ion implanted such that the region of clad layer 24 associated with slider 14 comprises an ion-implanted layer or region 25. For clarity, ion implanted region 25 and clad layer 24 are collectively referred to as clad layer 24.

Preferably, an insulating layer 26 is included adjacent to p-clad layer 24, and an outer metal layer 28 is included adjacent insulating layer 26. Insulating layer 26 is shown as a single layer, but may alternatively comprise multiple layers of different insulating materials. The substrate 12 includes generally a p-surface 30 proximate to metal layer 28 and an n-surface 32 proximate to n-semiconductor layer 18. The thickness of various layer components of substrate 12 are exaggerated for clarity, and it should be understood that the particular layer thicknesses shown in FIG. 1 are merely illustrative and are not necessarily to scale.

The n-clad layer 20 preferably comprises a reflective set or stack of n-doped distributed Bragg reflector or DBR mirrors. The n-DBR mirror stack 20 includes a plurality of n-doped quarter wave (λ/4) layer pairs 34. The p-clad layer, with the exception of the ion-implanted region 25 in slider 14, similarly comprises a set or stack of p-doped distributed Bragg reflector or DBR mirrors. The p-DBR mirror stack 24 includes a plurality of p-doped quarter wave (λ/4) layer pairs 36. The number of mirror pairs 34, 36 will vary generally according to the desired emissive performance for laser 16. The active region layer 22 preferably includes a plurality of quantum well and quantum barrier structures (not shown). The active region layer 22, as positioned between reflective p-DBR stack 24 and reflective n-BDR stack 20, defines an optical cavity for lasers 16, which operate as vertical cavity surface emitting lasers or VCSEL.

Preferably, an annular-shaped oxide region 38 is formed in p-clad layer 24. Oxide region 38 is formed by providing a plurality of oxidation channels or vias 39 which extend through p-clad layer 24 to the region of oxidation 38. The use of channels 39 for forming oxide region 38 is preferred over lateral oxidation techniques which offer less control over the shape of oxide region 38. The use of channels to form an oxide region in this manner is known in the art and is described more fully in U.S. Pat. No. 5,978,408. The optical mode of lasers 16 is defined by annular-shaped oxidized region 38 in p-DBR stack 24.

In the preferred embodiment, the materials of substrate 12 are based on GaAs and AlGaAs. Thus, n-semiconductor base or substrate layer 18 may comprise n-GaAs. The n-DBR stack 20 may comprise, for example, a plurality of n-$Al_{0.16}Ga_{0.84}As$/n-$Al_{0.96}Ga_{0.04}As$ quarter wave dielectric pairs, and p-DBR stack 20 may comprise a plurality of p-$Al_{0.16}Ga_{0.84}As$/p-$Al_{0.96}Ga_{0.04}AS$ quarter wave dielectric pairs. Insulating layer 26 may comprise $SiO_2$, other insulating metal oxide, or undoped GaAs. These particular materials and ratios are exemplary and will necessarily vary according to the particular features and characteristics required of laser 16, as is known in the art. Other semiconductor materials suitable for use with the invention include, for example and without limitation, Al GalnP, InGaAs, AlGaInN, InGaAsN, InGaAsP and InP.

As shown in FIG. 2, a portion of the insulating layer 26 and metal surface layer 28 is etched away or otherwise removed to define an aerodynamically shaped air flow cavity 40 on the p-surface of semiconductor substrate 12. The structure, configuration and depth of cavity 40 will generally vary according to the particular use of optical head 10, as is known in the art. Air flow cavity 40 defines generally an air bearing surface 42, defined generally by the plane of outer metal layer 28 on the slider portion 14 of substrate 12. As mentioned above, air flow cavity 40 is omitted from the cross-sectional view of FIG. 1.

Insulating layer 26 and metal layer 28 are also preferably etched or removed to define recessed areas 44 on the p-surface 30 of laser regions 16. Recessed areas 44 are structured and configured to accommodate annular shaped p-side electrical contacts 46. Annular p-side electrical contacts 46 are in electrical communication with p-DBR mirror stack 24, and are structured and configured to further define the mode of lasers 16. Recessed areas 44 and p-side electrical contacts 46 also define an emission face or facet 48 for each laser 16. Emission facets 48 are substantially coplanar with air bearing surface 42, as emission facets 48 and air bearing surface 42 both include un-etched metal layer 28 and insulating layer 26. An n-side electrical contact pad 50 is also provided on the n-surface 32 of substrate 12, with n-side contact being in electrical communication with n-GaAs substrate base layer 18.

It is desirable that air bearing surface 42 and emission facet 48 remain the uppermost or "highest" features on the p-surface of substrate 12, to ensure the aerodynamic properties of slider 14 and optical head 10. Thus, electrical connection with p-contact 46 is preferably achieved through a surface or portion of substrate 12 other than the p-surface 30. In this regard, the invention advantageously utilizes conductive channels or vias 52 which extend through substrate 12 and which communicates with p-side contacts 46 through conductive bridges 54. Conductive bridges 54 extend through cavity 40 (FIG. 2) and recesses 44, and remain beneath or below air bearing surface 42 and emission face 48. An insulating oxide or nitride layer 56 surrounds via 52 so that via 52 is not in electrical contact with substrate 12. Insulating oxide or nitride pads 58 are provided on n-GaAs layer 18, and conductive p-side contact pads 60 are positioned on insulating layers 58. P-side contact pads 60 are in electrical contact with conductive vias 52, and thus with conductive bridges 54 and p-side electrical contacts 46. In this manner, electrical connection to both n- and p-side contacts 50, 46 can be achieved on the n-side 32 of substrate and away from air bearing surface 42.

The upper p-DBR mirror stack 24 presents the dominant loss for laser 16, and represents the path through which output power of laser 16 is extracted. The number of dielectric layer pairs 34, 36 in DBR mirror stacks 20, 24 may be varied as required to control the optical power which is extracted from emission facet 48. Metal layer 28 preferably comprises a highly reflective metal such as Ag or Au, such that the reflectivity of metal layer 28 on emission face 48 acts together with p-DBR mirror stack 24. Preferably, an aperture 62 or other surface feature is included on emission facet 48 which cut or extends through reflective metal surface layer 28. The emission facet 48 thus presents two regions of differing reflectivities. The region surrounding the aperture 62 has a higher reflectivity due to the presence of the reflective metal layer 28. The region under aperture 62 would have a lower reflectivity due to the absence of reflective metal layer 28. For an aperture 62 of a particular or given area, the depth of the aperture 62 can be selected and adjusted such that a particular target loss can be achieved for laser 16. The use of an aperture 62 in emission facet 48 allows the majority of the optical output from emission facet 48 to be directed through aperture 62, thus providing a relatively small laser mode spot for nearfield optical reading and writing applications.

The method of the invention comprises, in its most general terms, preparing a single, monolithic semiconductor substrate 12, forming or defining at least one laser region 16 on the semiconductor substrate 12, and forming or defining a slider region 14 on the semiconductor substrate 12, with the laser regions 16 and slider region 14 being integral portions of the monolithic substrate 12. Preparing of the semiconductor substrate 12 preferably comprises providing a base layer 18 of n-semiconductor material, depositing an n-clad lower mirror layer 20 on the base layer 18, depositing an active region layer 22 on the n-clad lower mirror layer 20, depositing a p-clad upper mirror layer on the active layer, depositing at least one insulating layer 26 on the p-clad layer, and depositing an outer metal layer 28 on the insulating layer. Insulating layer 26 may comprise multiple layers of different (or the same) dielectric materials, but is shown as a single layer for clarity. Likewise, metal layer 18 may comprise multiple layers of the same or different types of metals, but is shown as a single layer for clarity. The layered structure of substrate 12 can be produced via conventional low-cost, high volume semiconductor IC fabrication methods using metal organic vapor phase epitaxy (MOVPE), liquid phase epitaxy (LPE) and molecular beam epitaxy (MBE) techniques which are well known in the art.

The defining of the laser region 16 is preferably carried out by creating an oxide or ion implant region 38 proximate to the active region layer 22 to define an optical mode for laser 16. The defining of laser further comprises depositing a p-side electrical contact 46 on the p-clad upper mirror layer, and an n-side contact 50 on the base layer 18 of n-semiconductor material, with the p-side contact 46 and n-side contact being structured and configured to define generally a diode across substrate 12. P-side contact 48 is further structured and configured to define emission facet 48. Preferably, depositing the p-side electrical contact also includes the formation of a p-contact via 52. The formation of oxide or ion implant region 38 is carried out on a portion of p-clad upper mirror layer 24 prior to deposition of all of the dielectric pairs 36 in layer 24, so that the annular oxide region or implanted ion region 38 is adjacent active region layer 22. Formation of the p-side and n-side electrical contacts 46, 50 is described below.

The defining of the slider region is carried out by etching or cutting through outer metal layer 28 and insulator layer 26 to create air flow cavity (FIG. 2) and define an air bearing surface 42 associated with the air flow cavity 40. In the small aperture laser embodiment of the invention described above, outer metal layer 28 will provide the air-bearing surface. Air flow cavity 40 may extend deeper into substrate 12 as required.

Figure 4A:
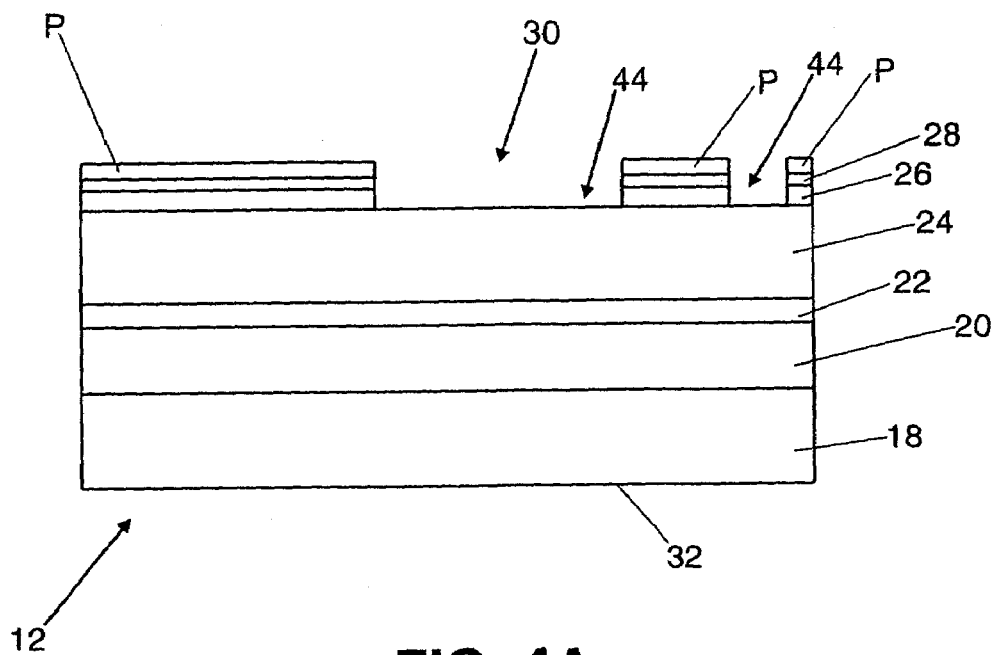
FIG. 4A is a side elevation view in cross-section of a semiconductor substrate with patterned photoresist applied on the p-surface and with etched portions in accordance with the method of the invention.

Referring now to FIG. 4A through FIG. 4G, as well as FIG. 1 through FIG. 3, one presently preferred method of making the optical head apparatus 10 in accordance with the invention is illustrated. In FIG. 4A, a photoresist P layer is shown applied to the p-surface of bulk substrate 12 via spin coating or other conventional technique. The photoresist P is patterned by standard photolithography techniques according to the shape of recessed portions 44. Following the coating and patterning of photoresist P, a conventional isotropic or anisotropic etching technique is used to remove metal layer 28 and insulator 26 to form recessed portions 44, as shown in FIG. 4A. The individual dielectric layer pairs 36, 34 in p-clad layer 24 and n-clad layer 20 have been omitted from FIG. 4A-FIG. 4G for clarity.

Figure 4B:
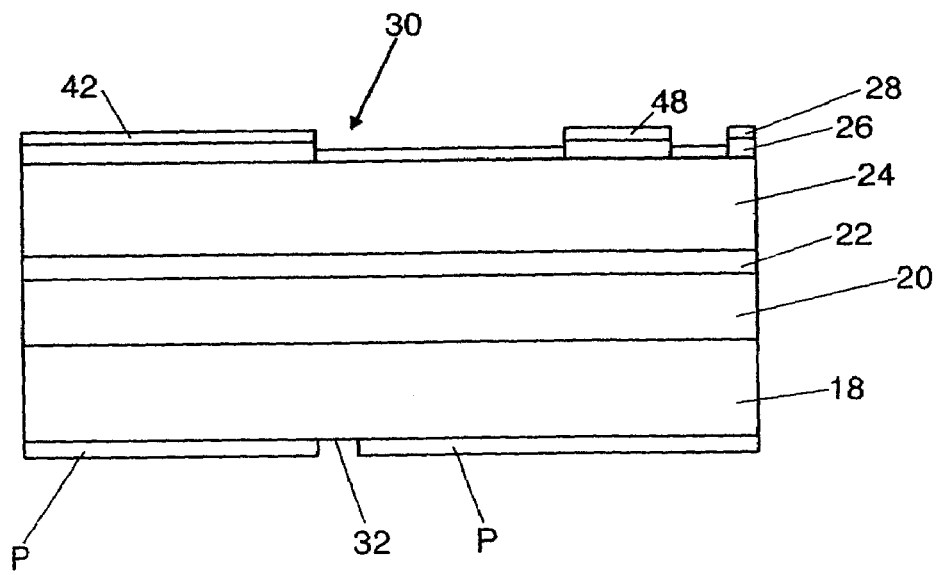
FIG. 4B is a side elevation view in cross-section of the semiconductor substrate of FIG. 4A with the etched portions metallized to form a p-side electrical contact and define the laser region and slider region of the optical head, and shown with patterned photo-resist on the n-surface.

Referring next to FIG. 4B, a metal layer is then deposited in recessed areas 44 to form p-side contacts 46 and conductive bridges 54. The photoresist shown in FIG. 4A is then stripped off as shown in FIG. 4B. The shape of p-contacts 46 define emission facets 48 and laser modes of lasers 16. At this point, another photoresist layer (not shown) may be coated onto p-surface 30 and patterned via photolithography according to the shape of air cavity 40. Etching (also not shown) is then used to form air cavity 40, after which the photoresist is removed. The air cavity thus created defines generally the air bearing surface 42 and slider portion 14 of substrate 12, as noted above.

Figure 4C:
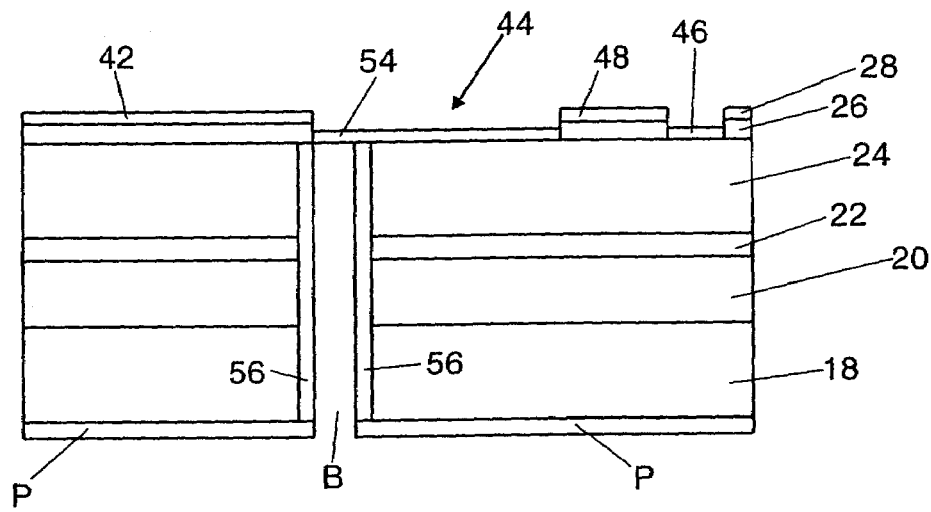
FIG. 4C is a side elevation view in cross-section of the semiconductor substrate of FIG. 4B shown with a via bore etched through the substrate and with an oxide layer included in the bore.
Figure 4D:
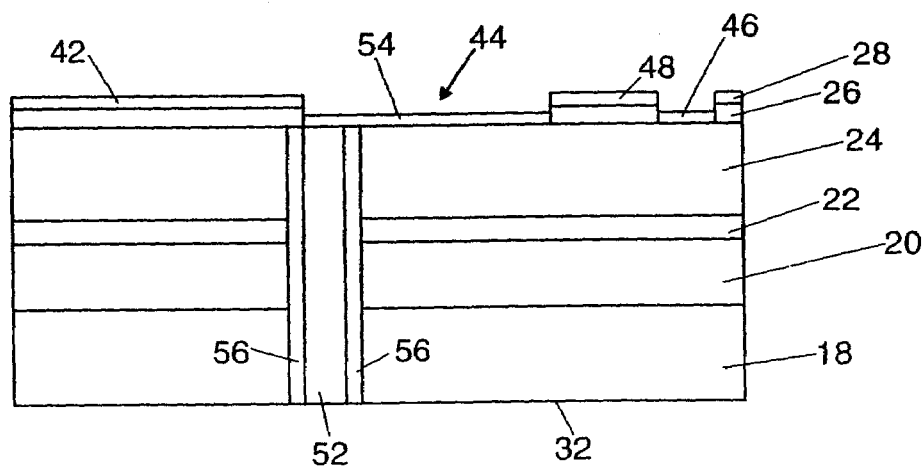
FIG. 4D is a side elevation view in cross-section of the semiconductor substrate of FIG. 4C showing the bore filled with metal to form the p-contact via and showing the photoresist stripped from the n-surface.

Following formation of p-contacts 46 and conductive bridges 54 in the manner described above, the n-surface 32 of substrate 12 is coated with photoresist P and patterned according to the cross-sectional shape of conductive via 52, as shown in FIG. 4B. An anisotropic etching technique, such as plasma etching or reactive ion etching, is then used to form a channel or bore B through substrate 12 to metal bridge 54, as shown in FIG. 4C. Lateral oxidation, sputter deposition, CVD, or nitride formation is then used in bore B to form an insulating dielectric layer 56 along the interior of bore B, as can be seen in FIG. 4C as well. In FIG. 4D, metal is shown deposited in bore B to form conductive vias 52, and photoresist P is stripped off p-surface 32.

Figure 4E:
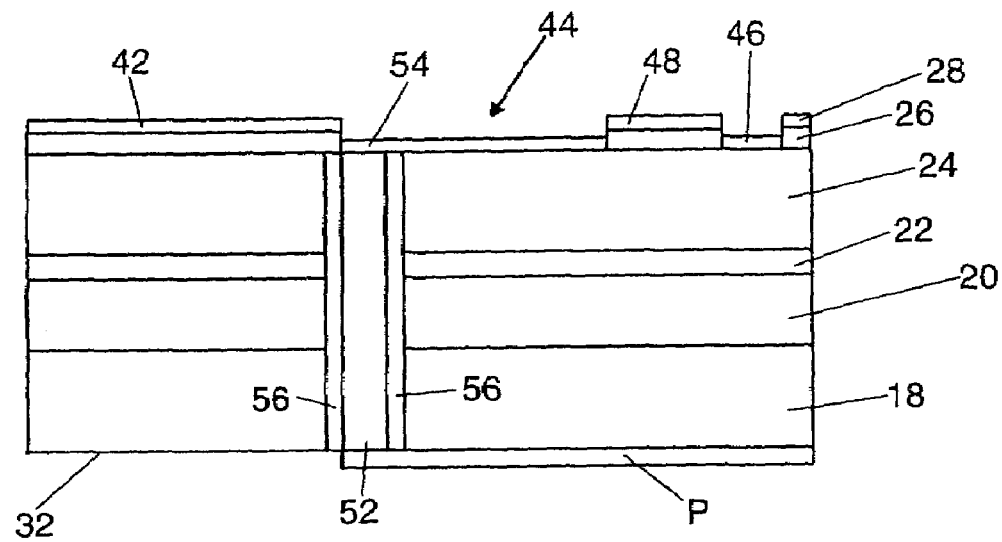
FIG. 4E is a side elevation view in cross-section of the semiconductor substrate of FIG. 4D, showing a patterned photoresist coated on the n-surface.
Figure 4F:
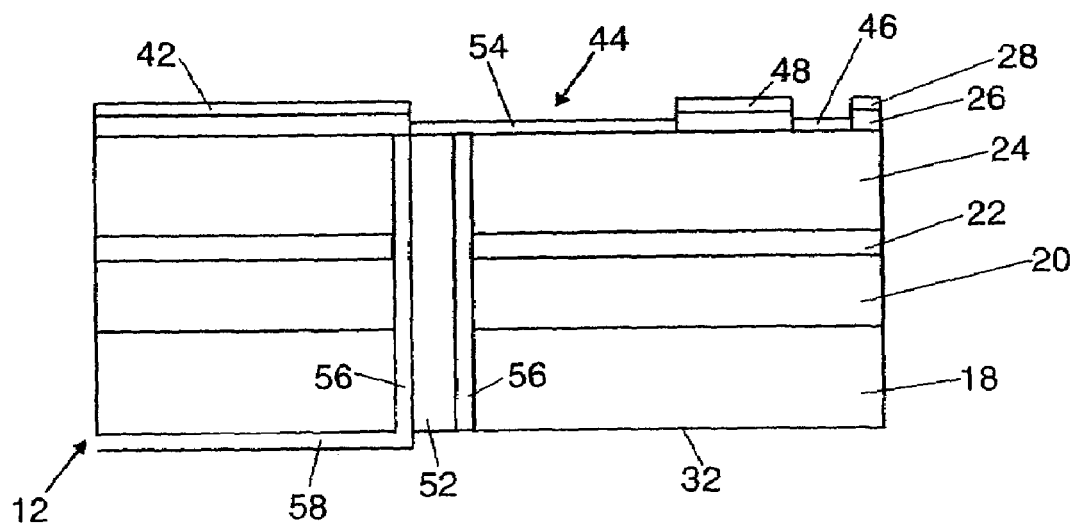
FIG. 4F is a side elevation view in cross-section of the semiconductor substrate of FIG. 4E, showing an oxide layer deposited on the n-surface and the photoresist stripped from the n-surface.
Figure 4G:
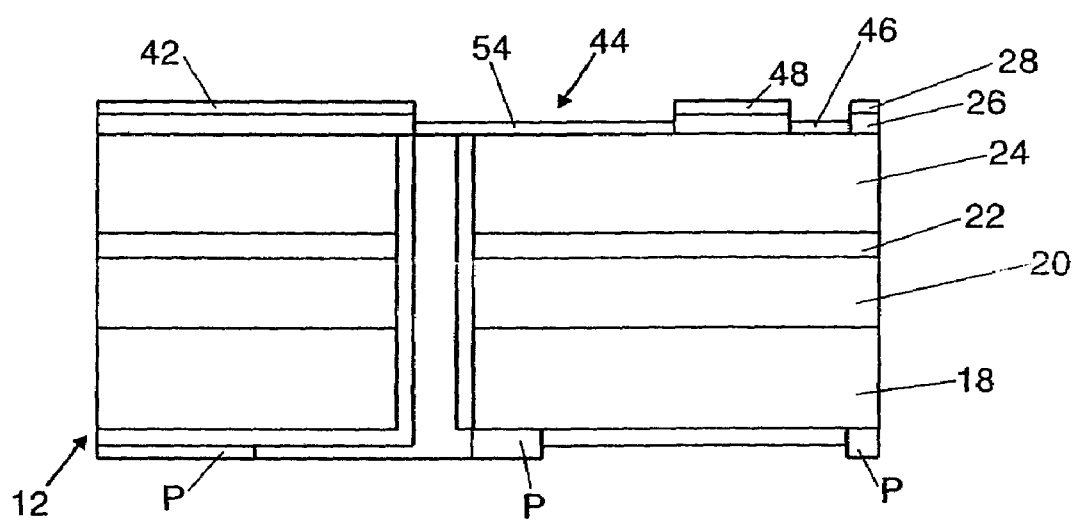
FIG. 4G is a side elevation view in cross-section of the semiconductor substrate of FIG. 4F showing a patterned resist on the n-surface and p-contact pad and n-contact pad metal layers deposited on the n-surface.

After formation of vias 52 as described above, a photoresist P is coated on n-surface 32 of substrate, as illustrated in FIG. 4E, and is patterned according to the shape of insulator pads 58. Referring next to FIG. 4F, an oxide layer is then deposited in a standard fashion according to the patterning of photoresist P to provide insulator pads 58. The photoresist P is then stripped off n-surface 32, as also shown in FIG. 4F. Referring now to FIG. 4G, a photoresist layer P is again deposited on n-surface 32 and is patterned according to the shape of p-side contact pads 60 and n-side contact 50. Metal is deposited according to the patterning of photoresist P to form p-side contact 60 and n-side contact 50. The photoresist P is then stripped away to provide the finished structure shown in FIG. 1.

Aperture 62 may be formed at this point by use of focused ion beam (FIB) machining process. Aperture 62 may alternatively be formed applying and patterning yet another photoresist coat (not shown) on p-surface 30, followed by anisotropic etching of aperture 62 and stripping of the photo resist. For near-field applications, the width w of aperture 62 will generally be somewhat less than the output wavelength $\lambda$, of laser 16, and FIB machining is presently preferred for forming a suitable small-dimensioned aperture 62 wherein w<$\lambda$. More preferably, aperture 62 is sized such that its width w is about equal to $\lambda/2$, and so that generally more than 50% of the power output from emission facet 48 is emitted from aperture 62.

The method of the invention as described above and outlined in FIG. 4A through FIG. 4G is exemplary, and the particular order of the events and the details of the fabrication process may vary and should not be considered limiting. For example, it is also contemplated that the bore for via 52, may be etched from the p-surface 30, rather than the n-surface 32 of substrate, prior to the deposition of metal bridges 54 and p-side electrical contacts 46. The etching of the air cavity 40 may also be carried out prior to etching recesses 44 for conductive bridges 54 and p-side contacts 46. Various other fabrication routes for the structure of the apparatus 10 will suggest themselves to those skilled in the art, and are also considered to be within the scope of this disclosure.

In an alternative embodiment, metal surface 28 may be omitted from substrate 12, such that dielectric layer 26 provides the outermost layer of substrate 12. In this embodiment, dielectric layer 26 provides both the air bearing surface 42 of slider 14 and the emission facet 48 of laser 16. Without metal layer 28, optical output from laser 16 would be distributed generally from all portions of the emission facet, rather than directed through aperture 48. Such an embodiment of the invention may be used for wider-beam illumination applications.

Figure 5:
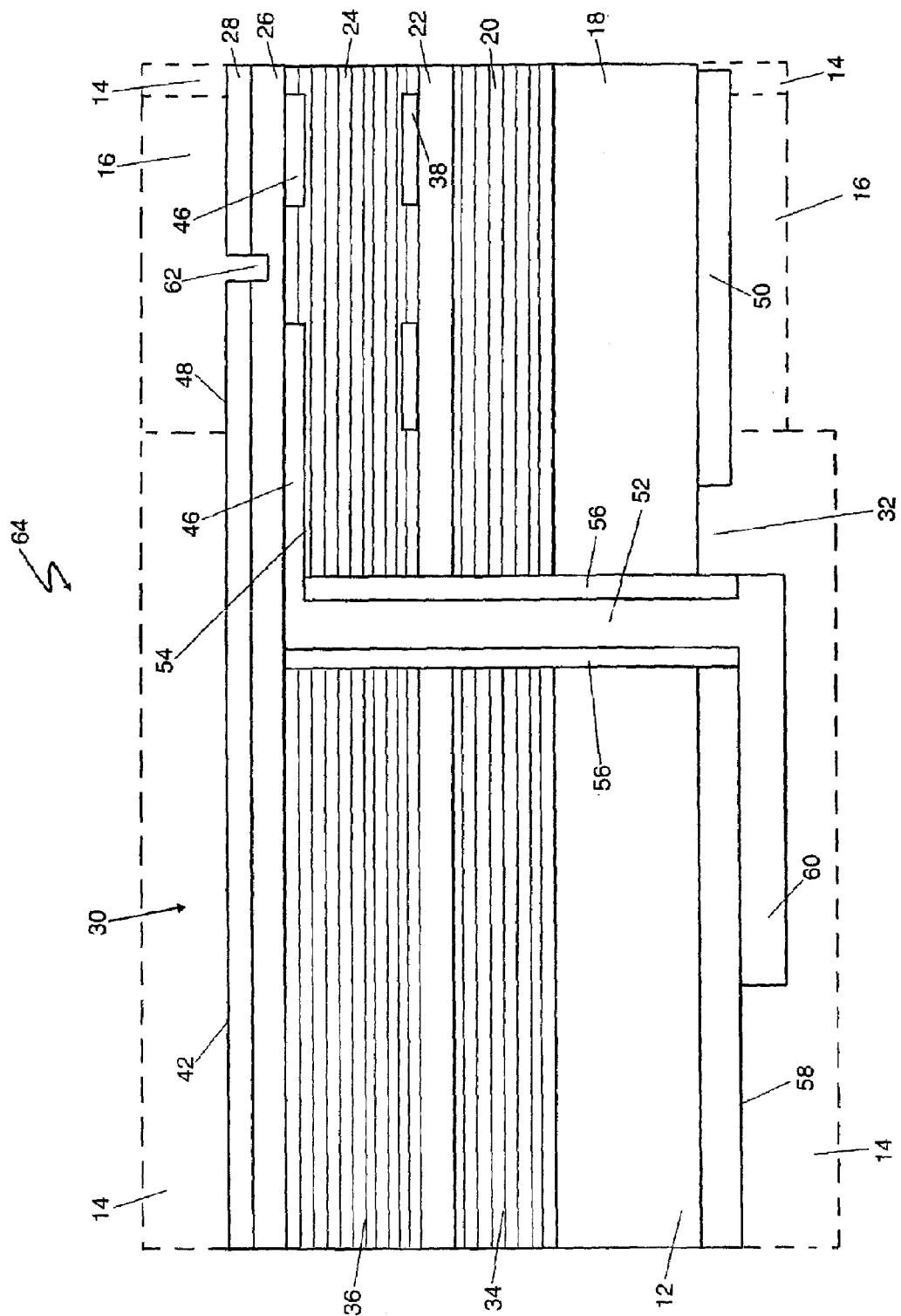
FIG. 5 is a side elevation view in cross-section of an alternative embodiment optical head apparatus having an integral solid state laser and slider in accordance with the invention.

Referring now to FIG. 5, there is shown a cross-sectional view of an alternative embodiment optical head apparatus 64, wherein like reference numbers are used to denote like parts. As in the apparatus 10 of FIG. 1, the various parts and distances are exaggerated for reasons of clarity, and are not necessarily drawn to scale. The optical head apparatus 64 is similar to the optical head apparatus 10 described above, and includes a monolithic semiconductor substrate 12 having a slider portion 14 and one or more laser integral laser portions 16.

Substrate 12 comprises a base layer 18 of n-doped semiconductor material, an n-doped clad layer 20 adjacent n-semiconductor layer 18, an active region layer 22 adjacent n-clad layer 20, and a p-doped clad layer 24 adjacent active region layer 22. The portion of p-clad layer associated with slider 14 may be ion-implanted as shown in FIG. 1 and described above. An insulating layer 26 is included adjacent to p-clad layer 24, and an outer metal layer 28 is included adjacent insulating layer 26. Insulating layer 26 may alternatively comprise multiple layers (not shown) of different insulating materials, as noted above. The substrate 12 includes a p-surface 30 proximate to metal layer 28 and an n-surface 32 proximate to n-semiconductor layer 18, and an oxidized or ion implanted region 38 which defines the mode of lasers 16. Oxidation channels as shown in FIG. 1 and described above may be used for formation of oxidized region 38. Metal layer 28 provides an air bearing surface 42 as noted above. The air cavity is not shown in the apparatus 64, but is generally structured and configured in the same manner as air cavity 40 in the apparatus 10 described above.

The apparatus 64 differs from apparatus 10 primarily in that conductive bridges 56 and p-side electrical contacts 46 are embedded within the p-clad layer, and the insulating layer 26 and metal layer 28 are positioned over conductive bridges 56 and p-side contacts 46, rather than etched away or removed to provide recesses 44 for conductive bridges 56 and p-side contacts 46 as in the apparatus 10. In this manner, conductive bridges 56 and p-side contacts 46 remain beneath air bearing surface 42 to provide an aerodynamically shaped slider 14.

The optical head 64 is fabricated by first preparing a substrate comprising a base layer 18 of n-semiconductor material, n-clad layer 20, active region layer 22, and p-clad layer 24, without insulating layer 26 or metal layer 28, so that the p-surface of substrate 12 is immediately adjacent p-clad layer. A photo resist is coated onto the p-clad layer and patterned according to the shape of conductive bridges 56 and p-side contacts 46. The p-clad layer is then etched to define recesses for the conductive bridges 56 and p-side contacts 46, and metal is deposited therein to form conductive bridges 56 and p-side contacts 46, with the metal upper surface being generally flush with the p-surface of substrate. The insulating layer 26 and metal layer 28 are then deposited on top to provide a smooth air bearing surface 42 for the slider portion 14, and emission facet 48 of for laser portion 16, which are generally coplanar, as noted above. Aperture 62 is cut into emission facet 48 via FIB machining. In all other respects, optical head 64 is substantially the same as the optical head 10 described above.

Figure 6:
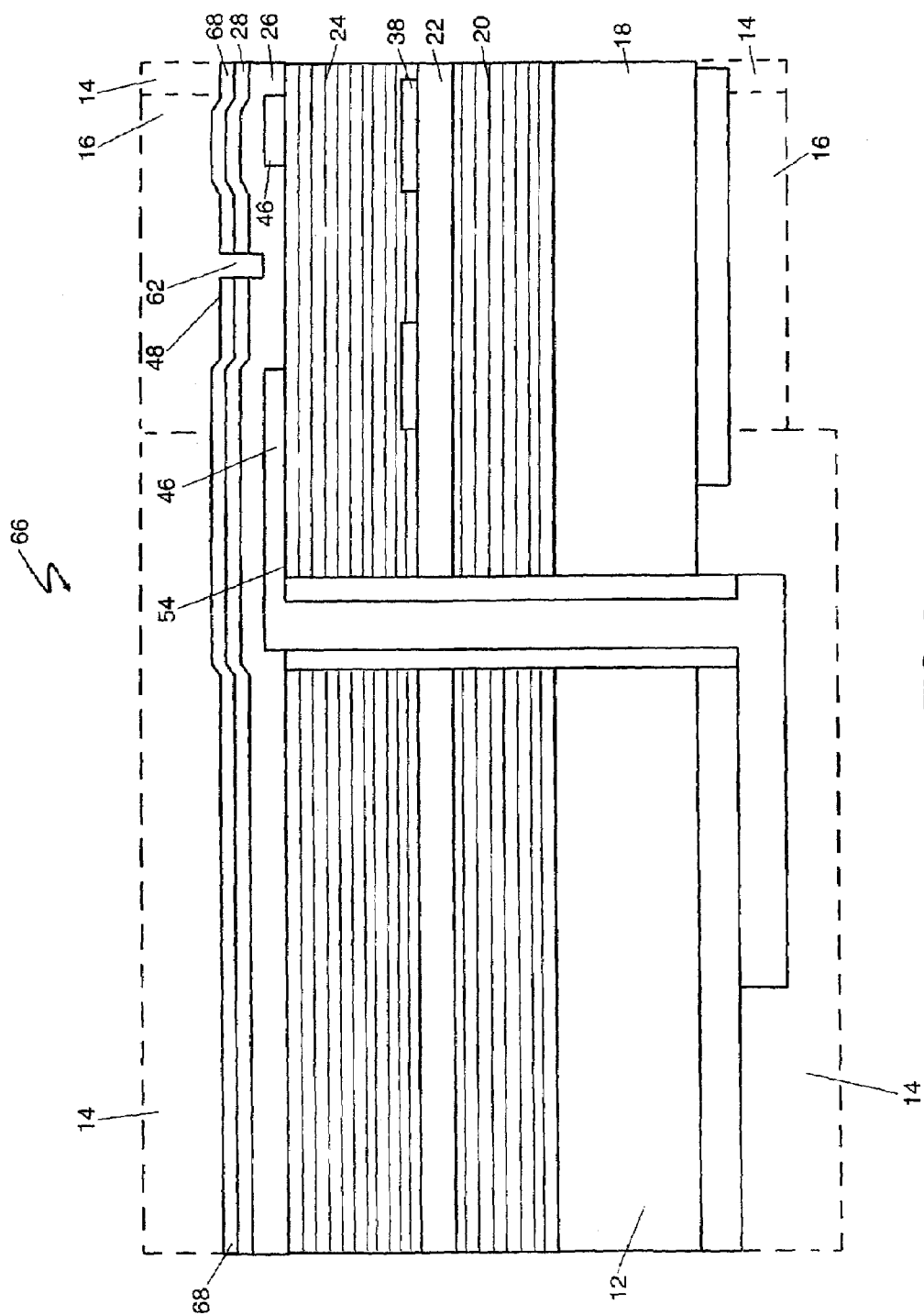
FIG. 6 is a side elevation view in cross-section of another alternative embodiment optical head apparatus having an integral solid state laser and slider in accordance with the invention.

Referring to FIG. 6, there is shown yet another presently preferred embodiment optical head apparatus 66 in accordance with the invention, wherein like reference numbers are used to denote like parts. Once again, the various parts and distances of optical head 66 are exaggerated for reasons of clarity, and are not necessarily drawn to scale. The optical head apparatus 66 is similar to the optical head apparatus 10 and 64 described above, having a monolithic semiconductor substrate 12 having a slider portion 14 and one or more laser integral laser portions 16. Substrate 12 comprises an n-doped semiconductor layer 18, an n-doped clad layer 20 adjacent n-semiconductor layer 18, an active region layer 22 adjacent n-clad layer 20, and a p-doped clad layer 24 adjacent active region layer 22, as related above, with an insulating layer 26 included adjacent to p-clad layer 24, and an outer metal layer 28 is included adjacent insulating layer 26. The portion of p-clad layer 24 associated with slider 14 may be ion implanted as described above. Oxidized or ion-implanted region 38 defines the optical mode of laser 16, and may be formed by oxide channels (not shown) in the manner described above. The air cavity (not shown) in the apparatus 66 is generally structured and configured in the same manner as air cavity 40 in the apparatus 10 described above.

In the optical head 66, the conductive bridges 56 and p-side contacts 46 are deposited directly onto p-clad layer 24, without any etching of the p-clad layer 24 to form recesses for conductive bridges 56 and p-side contacts 46 prior to their deposition. The insulating layer 26 is then deposited directly on top of the conductive bridges 56 and p-side contacts 46 and p-clad layer 24, and metal layer 28 is deposited on top of insulating layer 26. The presence of conductive bridges 56 and p-side contacts 46 directly on top of p-clad layer 24 results in some surface topography at the air bearing surface 42, as the insulating layer 26 and metal layer 28 must conform to the topography of the underlying conductive bridges 56 and p-side contacts 46.

Such surface topography is generally undesirable in an air bearing surface, but is acceptable for certain designs and uses. The deposition of conductive bridges 56 and p-side contacts 46 directly onto p-clad layer eliminates several events associated with photoresist coating, photolithography, etching of recesses for the conductive bridges 56 and p-side contacts 46, and then stripping the photoresist. Thus, elimination of these events represents a substantial cost advantage. The surface topography at air bearing surface 42 can be reduced or eliminated by adding one or more additional planarization layers 68 on top of metal layer 28. Aperture 62 in emission face 48 is etched through planarization layer 68. Additionally, the planarization layer 68 can be mechanically polished to reduce or eliminate surface topography at the air bearing surface 42.

The optical head 66 results in an aperture 62 which is recessed with respect to outer coating or layer 68 above metal layer 28, and is generally less preferable than optical head apparatus 10 and 64 as described above.

Figure 7:
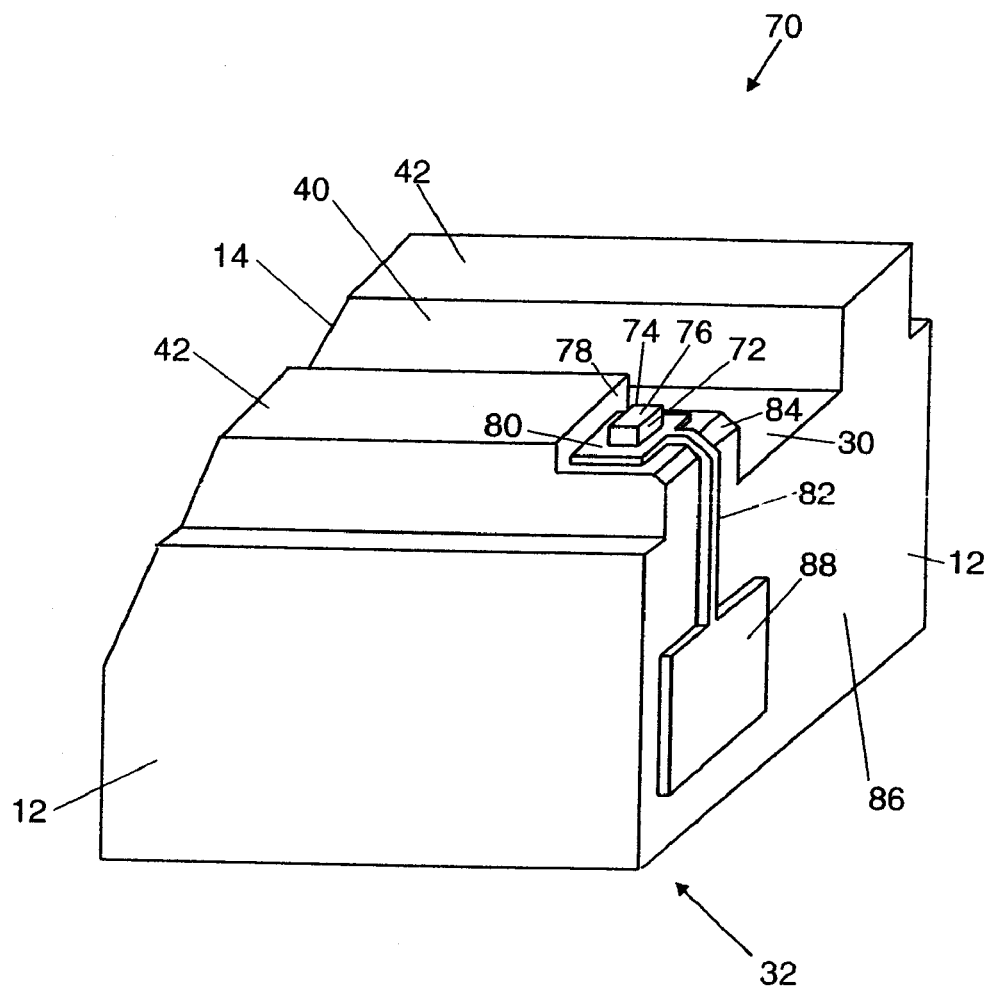
FIG. 7 is a perspective view of a portion of still another alternative embodiment optical head apparatus comprising integral solid state lasers and slider in accordance with the invention.

Referring now to FIG. 7, yet another presently preferred embodiment optical head apparatus 70 in accordance with the invention is shown as a partial perspective view. As in the above-described embodiments, various parts and distances are exaggerated for reasons of clarity, and are not necessarily shown to scale. The optical head apparatus 70 includes a single monolithic semiconductor substrate 12 having an integral slider portion 14 and laser 72, with the laser 72 shown as having a generally rectangular configuration. The substrate includes an n-doped semiconductor layer, n-doped clad layer, active region layer 22, p-doped clad layer, insulating layer 26, and outer metal layer, which are not shown. Laser 72 has an emission face 74 with two apertures 76. Emission face 74 is substantially co-planar with air bearing surface 42. The air bearing surface 42, air channel 40, laser 72 and other features of FIG. 7 are exaggerated in size for clarity and are not shown to scale.

A recessed portion 78 accommodates an annular, rectangular shaped p-side electrical contact 80 on laser 72. A conductive bridge 82 extends around corner 84 and down along a side 86 of substrate 12 and connects with a p-contact pad 88 mounted on the side 86 of substrate 12. Electrical connection with p-contact 80 can thus be achieved via p-contact pad 88 on the side 86 of substrate 12, without interfering with the aerodynamic air bearing surface 42 or air cavity 40 associated with the p-surface 30 of substrate 12.

The optical head 70 of FIG. 7 differs from the optical heads 10, 64 and 66 described above primarily in that the p-side contact pad 88 is located on the side 86 of substrate 12, rather than on the n-side 32 as described above. Side 86 is positioned such that contact pad 88 is remote from air bearing surface 42, so that p-side contact 46 can be electrically accessed from a portion or region of optical head 10 which is remote from air bearing surface 42. In this manner, electrical connections to laser 16 do not interfere with the aerodynamic operation of slider 14. In the embodiment shown in FIG. 7, side 86 is substantially normal to air bearing surface 42. The term "substantially normal" to air bearing surface 42 is intended to broadly encompass any surface or region on optical head 10, 64, 66 which is other than parallel to air bearing surface. The location of p-contact pad 88 on side 86 of substrates avoids the need to form a conductive metal via through the substrate in the manner related above. The optical head 70, however, will require coating and patterning of photoresist, followed by deposition of metal bridge 82 and p-contact pad 88, on the relatively narrow side 86 of substrate 12 rather than on the relatively broad n-surface as described above in the other embodiments of the invention. Various other locations for contact pad 88 which are remote from air bearing surface 42 will suggest themselves to those skilled in the art, and are also considered to be within the scope of the invention.

Figure 8:
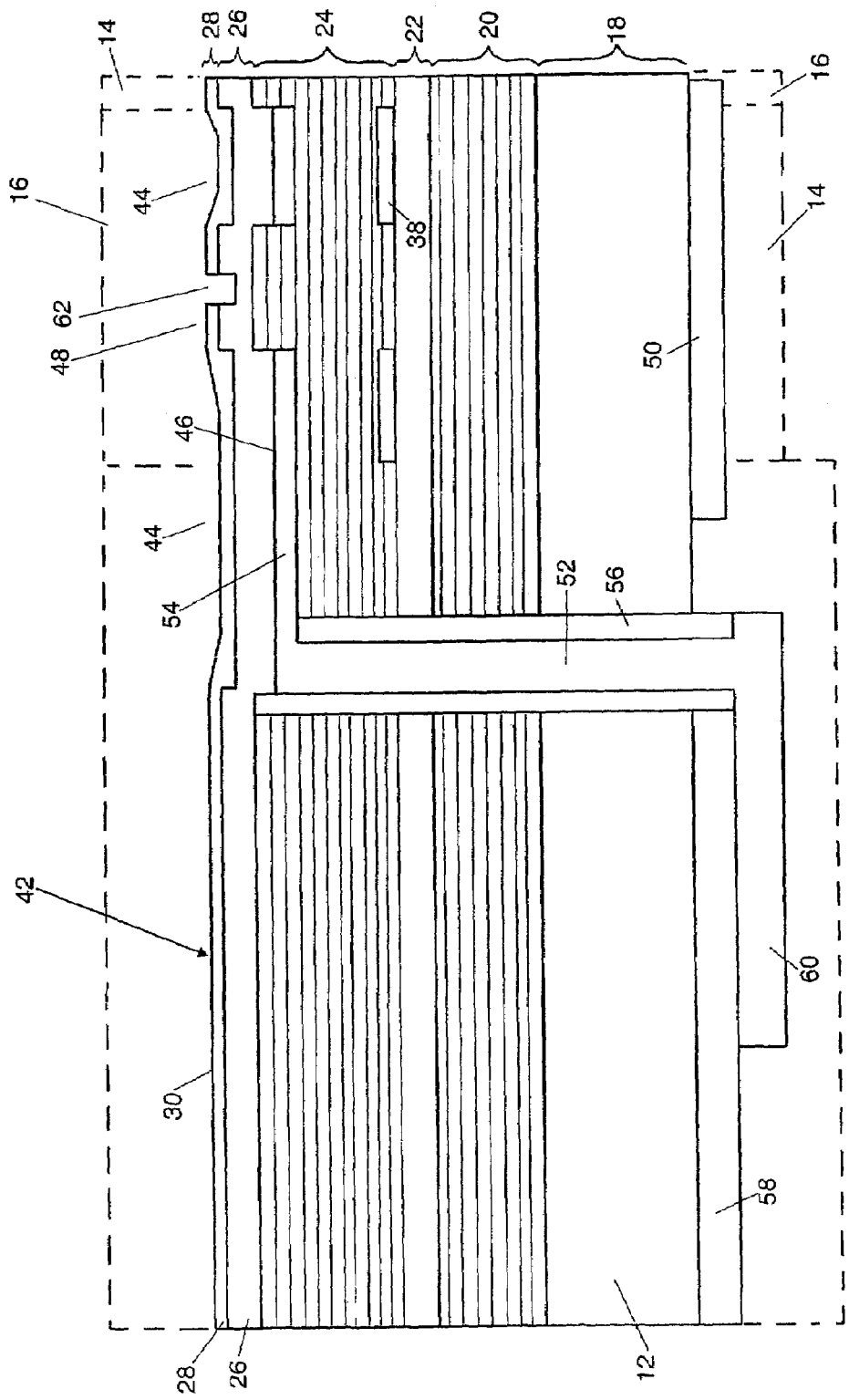
FIG. 8 is a side elevation view in cross-section of yet another alternative embodiment optical head apparatus with integral solid state lasers and slider, in accordance with the invention.

Referring next to FIG. 8, another alternative preferred embodiment optical head apparatus 90 in accordance with the invention is shown generally in cross-section, wherein like reference numbers are used to denote like parts. The various parts may be exaggerated in size or distance for clarity, and should not be considered as limiting. The optical head apparatus 90 is similar to the optical head apparatus 10 and 64 described above, and includes a monolithic semiconductor substrate 12 having a slider portion 14 and one or more laser integral laser portions 16. Substrate 12 comprises generally the same layer structure and materials as described above. Optical head 90 includes an aircavity (not shown) etched generally into p-surface 30 to a suitable depth, in the manner shown in FIG. 2 and described above.

In the apparatus 90, conductive bridges 56 and p-side electrical contacts 46 are embedded or recessed within the p-clad layer 24, as in optical head 64 described above. In the apparatus 90, however, conductive bridges 56 and p-side electrical contacts 46 are positioned deeper within p-clad layer 24 than in the apparatus 64, such that the top of conductive bridges 56 and p-contacts 46 is generally below the top surface of p-clad layer 24, as can be seen in FIG. 8. Insulating layer, and the insulating layer 26 and metal layer 28 are positioned over conductive bridges 56 and p-side contacts 46. Because of the deeper, more recessed location of conductive bridges 56 and p-side contacts 46 within p-clad layer 24, insulating layer 26 and metal layer 28 do not lie flat upon p-clad layer 24, conductive bridges 56 and p-side contacts 46, but instead exhibit some surface topography. As a result, insulator layer 26 and metal layer 28 are slightly recessed over the conductive bridges 56 and p-side contacts 46 with respect to the rest of substrate 12 and optical head 90. Emission facet 48 is generally elevated or raised with respect to the surrounding portions of substrate 12. Emission facet 48 and air bearing surface 42 are substantially coplanar.

The optical head 90 is fabricated in basically the same manner as described above for optical head 64, with the primary exception being that p-clad layer 24 is etched somewhat deeper than shown in FIG. 5, so that when bridge 56 and p-contact 46 are deposited, they are recessed within p-clad layer 24 as noted above. In other respects, optical head 90 is substantially the same as the optical head 10 and optical head 64 described above. The portion of p-clad layer 24 associated with slider 14 may be ion implanted, and oxide channels may be used to form oxide region 38, as described above.

Figure 9:
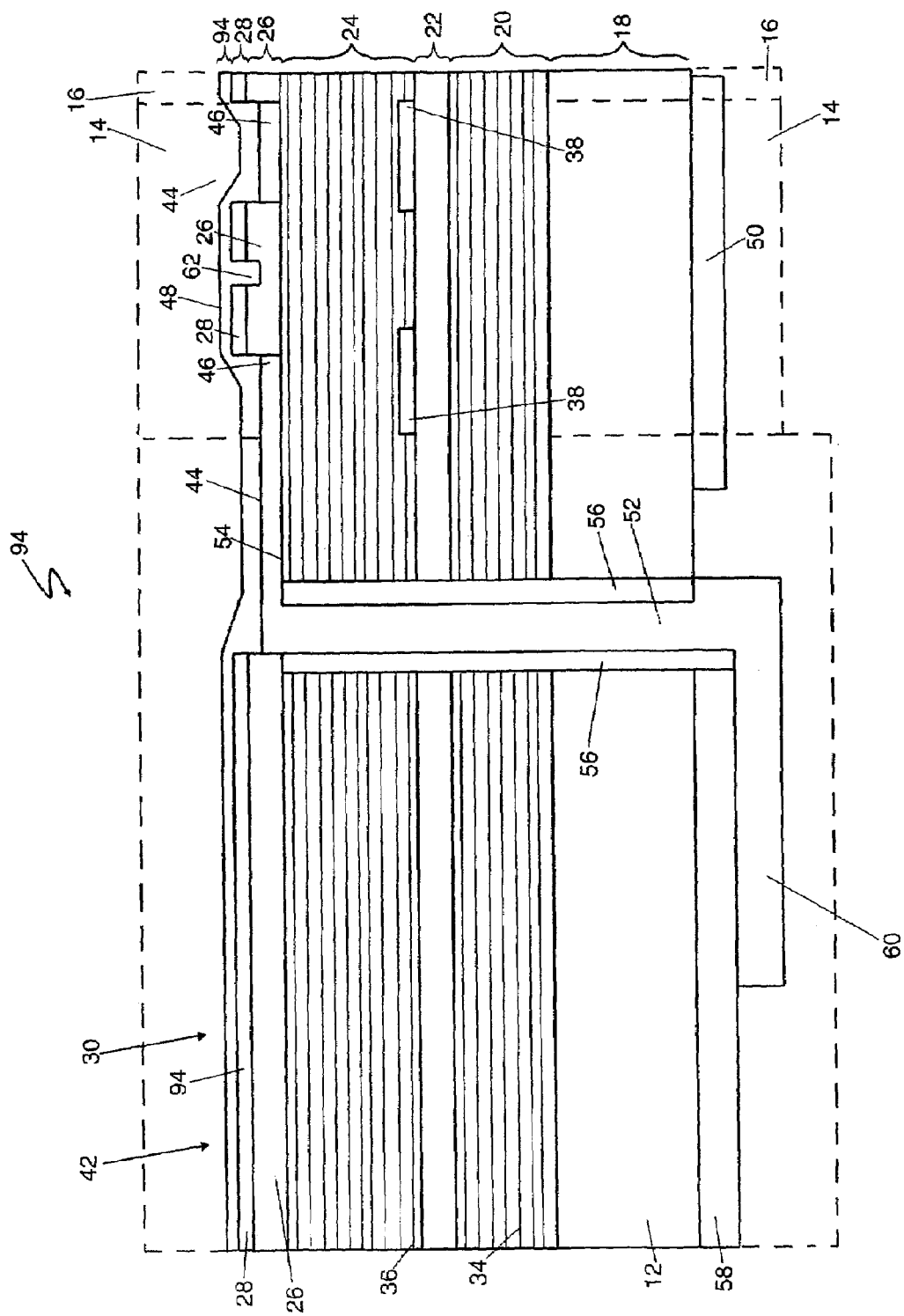
FIG. 9 is a side elevation view in cross-section of another alternative embodiment optical head apparatus with integral solid state lasers and slider, in accordance with the invention.

Referring to FIG. 9 now, another alternative embodiment optical head apparatus 92 in accordance with the invention is shown. As in the above-described embodiments, various parts and distances are exaggerated for clarity, and are not necessarily shown to scale. In the optical head 92, conductive bridges 56 and p-side electrical contacts 46 are recessed or embedded within p-clad layer 24, with insulating layer 26 and metal layer 28 removed from above conductive bridges 56 and p-side electrical contacts 46.

A protective, outer overcoat layer 94 is deposited along the top of substrate 12 as shown, and aperture 62 in emission facet 48 extends through overcoat layer 94 and metal layer 28. Optical head 92 includes an air cavity (not shown) etched into p-surface 30, which is generally structured and configured as shown in FIG. 2. The protective layer 94 may comprise any material having appropriate tribological properties for an air bearing surface. The protective layer may comprise, for example, boron carbide, aluminum carbide or other group III carbide, boron nitride, aluminum nitride or other Group IV nitride, silicon carbide or other group III carbide, a metal or metal alloy, a metal carbide, metal nitride, diamond, diamond-like carbon, hydrogenated carbon, fluoride material, or fluoropolymer. The term "metal" as used in connection with protective layer 94 means generally any alkali or alkaline earth metals, transition metals (including Groups IIIb, IVb, Vb, Vib, VIIb, VIIIB, Ib, IIb), as well as lanthanide and actinide metals. The protective layer may also comprise a fluoride material or fluorocarbon polymer based on fluorinated ethylene, fluorinated propylene and/or fluorinated ether polymer. Various other materials for protective layer 94 will suggest themselves to those skilled in the art, and are also considered to be within the scope of this disclosure.

The apparatus 92 is prepared by forming substrate 12 in the manner described above, and then patterning and etching substrate such that insulating layer 26 and metal layer 28 are removed from the are whereon conductive bridges 56 and p-side electrical contacts 46 will be deposited. The etching does not extend, however, into p-clad layer 24 as in the embodiments shown in FIG. 5 and FIG. 8. Thus, conductive bridges 56 and p-side electrical contacts 46 are deposited on top of p-clad layer 24, with the top of conductive bridges 56 and p-side electrical contacts 46 being generally lower than the surrounding insulation layer 26 and metal layer 28. When protective overcoat 94 is subsequently deposited across the top of substrate 12, some surface topography remains due to the recessed location of conductive bridges 56 and p-side electrical contacts 46. The emission facet 48 is advantageously positioned higher than the surrounding surface, with the emission facet 48 and air bearing surface 42 being substantially coplanar.

The outermost protective layer 94 is preferably a diamond-like carbon (DLC) coating, to provide good wear resistance and thermal control. The DLC coating 94 may be prepared by direct ion beam, dual ion beam, glow discharge, RF plasma, DC plasma, microwave plasma, e-beam evaporation, ion-assisted evaporation, magnetron sputtering, ion-assisted sputtering, or other DLC deposition techniques.

The invention has been disclosed so far in terms of use with a VCSEL laser, it. The VCSEL structure lends itself to relatively quick and easy fabrication with good reproducibility, uniformity and reliability. Edge-emitting diode laser devices can generally provide higher optical power than VCSEL devices, and the present invention accordingly contemplates use with edge emitting lasers for applications wherein higher output power is beneficial.

In one embodiment of the invention employing an edge emitting laser, the base n-semiconductor layer of the substrate would generally be much thicker than is shown for the VCSEL embodiments above. The n-semiconductor layer would provide the bulk of the slider region in the substrate, while the n-clad layer, active region layer, and p-clad layer would define the laser. The emission face would be on the edge or side of the substrate rather than the p-side, and would be associated with the portion of the active region adjacent the substrate edge. The air bearing surface would be deposited and defined on the edge of the relatively large n-semiconductor portion of the substrate. The p- and n-electrical contacts could be placed on the p- and n-surfaces of the substrate in a conventional manner, since the air bearing surface would be on the side or edge of the substrate and the electrical contacts would thus not interfere with the air bearing surface. Various other approaches to forming an integral edge emitting laser and slider on a single monolithic semiconductor substrate may suggest themselves to those skilled in the art upon reviewing this disclosure, and such other approaches are considered to be within the scope of this invention.

Figure 10:
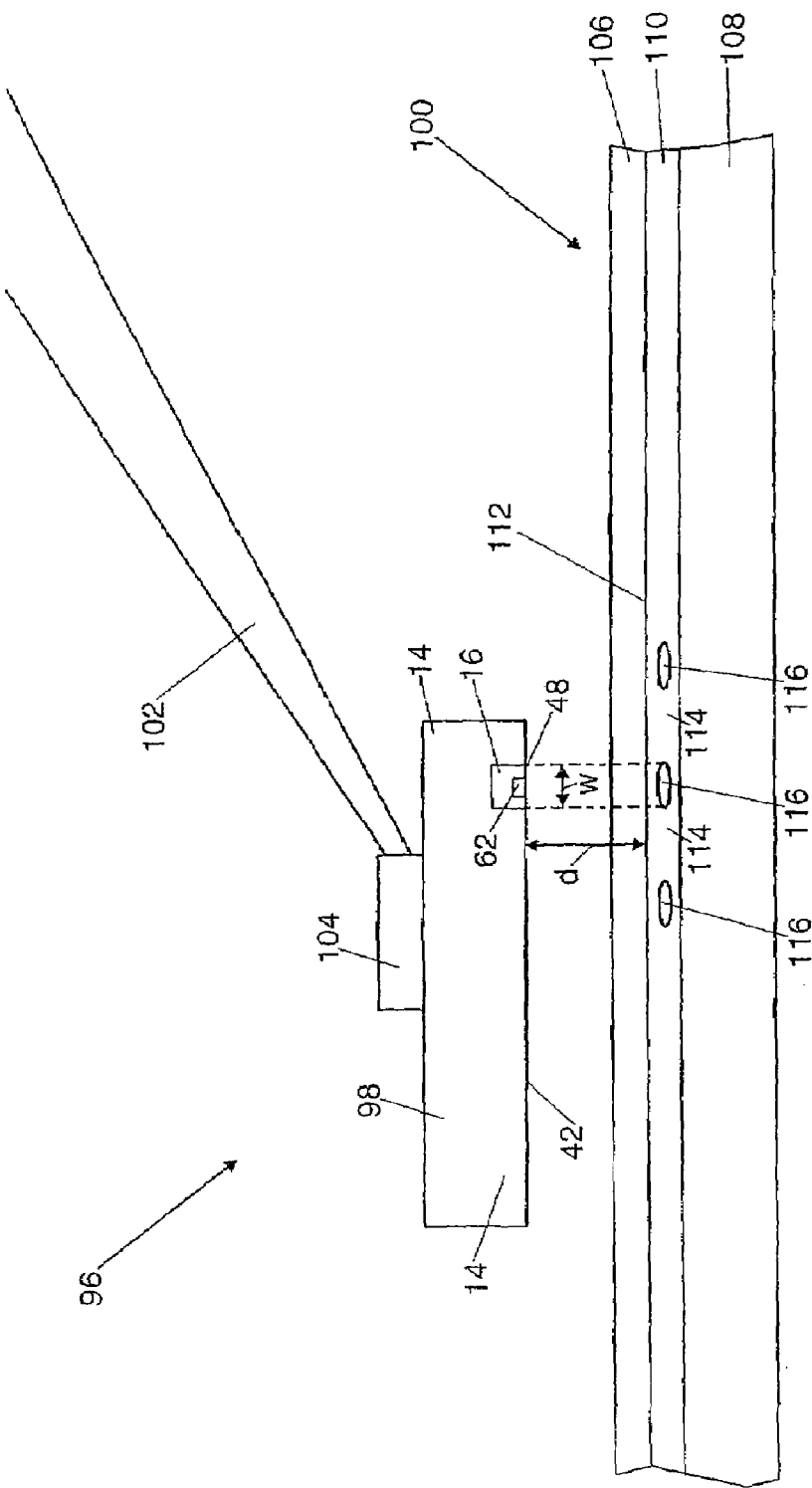
FIG. 10 is a schematic side elevation view of preferred embodiment of a near-field optical system in accordance with the present invention.

Referring now to FIG. 10, by way of example and not necessarily of limitation, a near-field optical system 96 in accordance with the invention is illustrated, wherein like reference numbers are used to denote like parts. The various parts and distances of system 96 are exaggerated for reasons of clarity, and are not necessarily drawn to scale. The system 96 includes an optical head 98, and an optical medium 100 positioned proximate thereto. Optical head 98 comprises a single, monolithic semiconductor substrate having an integral slider portion 14 and one or more integral laser portions 16, as noted above. Optical head 98 may be structured and configured in accordance with any of the various optical head embodiments described above. Optical head 98 is mounted on a conventional read/write suspension 102 via a conventional gimbal mechanism 104. Slider portion 14 includes an air bearing surface 42, and laser portion 16 includes an emission facet 48 which is generally co-planar with air bearing surface 42, as described above.

An aperture 62 is included in the emission facet 48 of laser 16. Preferably, aperture 62 is structured and configured such that aperture has a width w which is less than or smaller than the output wavelength $\lambda$ of laser 16 (w<$\lambda$). More preferably, aperture 62 is structured and configured such that w<$\lambda$/2.

Optical medium 100, in one embodiment, comprises an outer protective layer 106, a base or substrate layer 108, and a layer 110 of read/write material positioned between the outer layer 106 and substrate 108. Outer protective layer 106 may comprise diamond-like carbon as described above or a hard protective dielectric material. A lubrication or tribological layer (not shown) may be included on top of protective layer 106. The read/write material layer 110 generally comprises a material which undergoes a detectable change in reflectivity when written upon by laser 16 or other laser, with the reflectivity change detected during readout of medium, in a conventional manner. Read/write layer 110 thus defines generally a reflective surface 112. Substrate 108 may comprise a variety of glass, plastic, metal or other conventional substrate materials.

The read/write layer 110 generally comprises a material which undergoes an optically detectable change upon writing with a laser. Such materials include, for example, magneto-optic, dye, dye-polymer blend, ferroelectric, photoresist, ablative, and other materials for re-writable and write-once-read-many (WORM) embodiments. More preferably, read/write layer 110 comprises a reversible "phase change" material such as a GeTeSb alloy material which can undergo phase changes between a crystalline phase with relatively high reflectivity, and amorphous phase with relatively low reflectivity. The phase change material can be used such that writing is carried out on a low reflectivity amorphous phase to generate high reflectivity, crystalline phase write spots, or such that writing is carried out on a high reflectivity crystalline phase to generate low reflectivity amorphous write spots. For illustrative purposes, the GeTeSb material in read/write layer 110 is shown as comprising highly reflective polycrystalline portion or section 114 which, upon writing with laser 16, is melted and then subsequently cooled to form lower reflectivity amorphous phase melt spots 116 to record data. Phase change layer 110 is generally situated between two thermally resistant dielectric layers, as described further below.

Presently, a phase change material comprising various GeTeSb alloys are preferred. These materials generally have a melting temperature of around 700° C. for writing, and provide melt spot sizes comparable size to the area of aperture 62 on emission facet 48 under near-field conditions. These materials generally provide a low reflectivity of around 0.7% from the amorphous regions 116, and a high reflectivity of around 34% from the polycrystalline regions 114. The GeTeSb materials have shown a reliable re-writability of around one hundred cycles, with crystallization times of between 17 and 50 ns, which allows high writing rates. The use of GeTeSb alloys in optical disks is well known and is described, for example, in U.S. Pat. No. 4,847,123, U.S. Pat. No. 5,128,099, U.S. Pat. No. 5,233,599, and U.S. Pat. No. RE36,383.

In order to effect writing on medium 100, output from laser 16 is used to locally heat the high reflectivity polycrystalline region 114 above its melting point, which then cool to create amorphous spots or regions 116 of relatively low reflectivity. The embedding of the phase change material in a multilayer structure can effect the net reflectivities of amorphous spots 116 and polycrystalline regions 114.

Readout is obtained by flying laser 16 over optical medium 100 and measuring the changes in reflection associated with the low reflectivity amorphous spots 116 and higher reflectivity unmelted, polycrystalline regions 1114. Readout may be accomplished in either transmission or reflection embodiments, as amorphous spots 116 have generally different transmissivity than polycrystalline regions 114. In a transmission embodiment, a detector is placed opposite the laser 16 on the opposite side of medium 100, and variations in the transmissivity of the medium 100 due to amorphous spots 116 and polycrystalline regions 114 result in variations in the transmitted and detected light. In a reflection embodiment, light reflected from medium 100 back into laser 16, affecting laser detectable properties, including light output, laser voltage and/or laser current (see, e.g., U.S. Pat. No. 5,626,617 to Hopkins et al., U.S. Pat. No. 4,480,276 to Ukita et al., and U.S. Pat. Nos. 4,460,977 and 4,449,204 to Shimada et al.) In one exemplary embodiment, variations in reflectivity of medium 100 are detected as data by monitoring the voltage modulation of laser 16 operating at a constant current. In another exemplary embodiment, variations in reflectivity of medium 100 are detected as data by monitoring the variation in light output from a rear facet of laser 16, as discussed further below.

Erasure is effected in medium 100 by locally heating layer 110 to return the amorphous phase write spots 116 back to the polycrystalline phase 114.

Optical head 98 and optical medium 100 are positioned, during reading and writing, such that emission facet 48 and the reflective surface 112 of optical medium 100 are separated by an optical path-length d defined generally by $d=\int n(z)dz$, where z measures the distance between aperture 62 and read/write layer 110, and n(z) is the index of refraction as a function of distance z, which comprises generally the refractive index of the air gap and outer layer 106, as well as any additional material layers between outer layer 106 and read/write layer 110. In one preferred embodiment, the optical path length d will be generally less than or equal to w/2.

Figure 11:
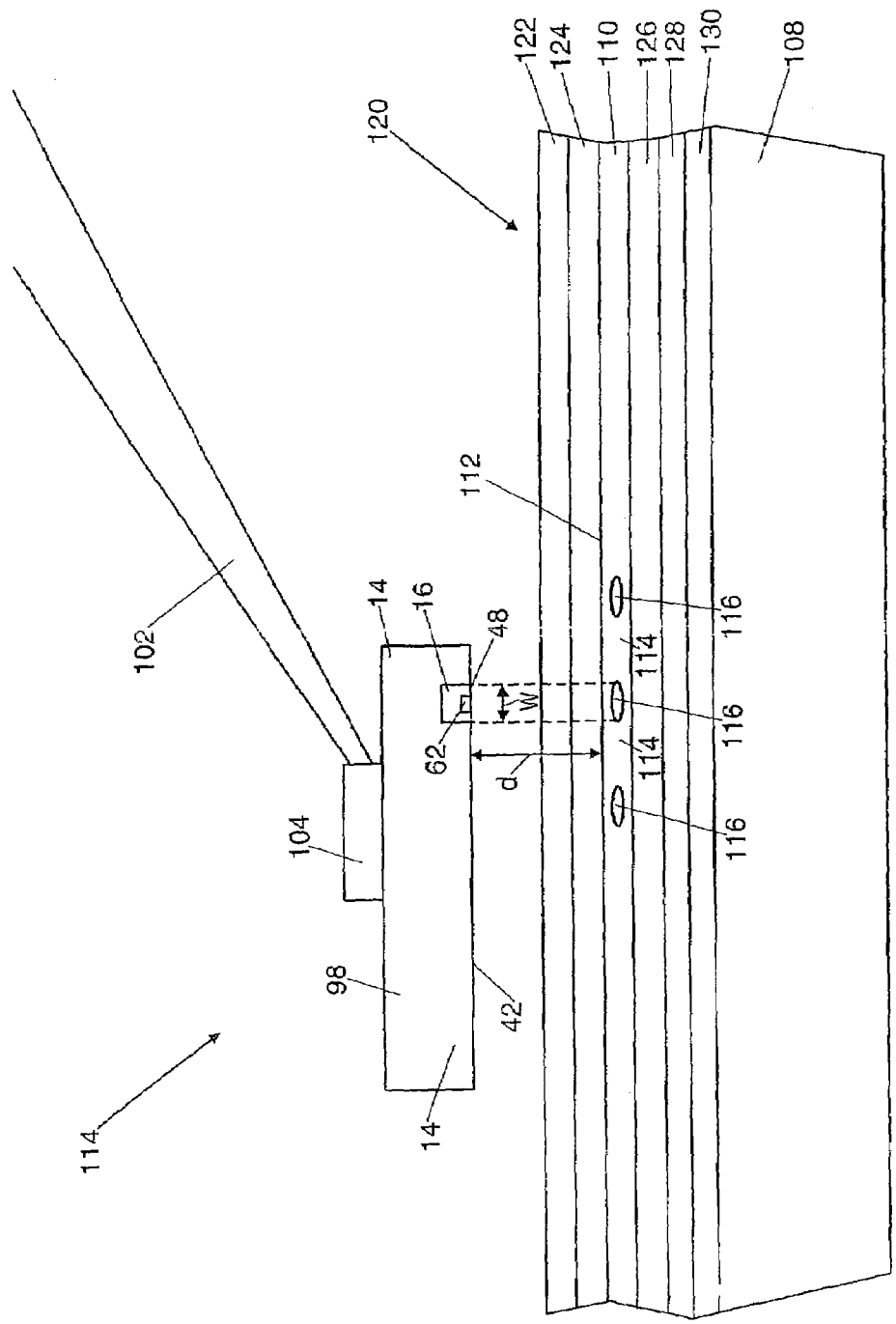
FIG. 11 is a schematic side elevation view, in partial cross-section, of an alternative preferred embodiment near-field optical system in accordance with the present invention.

Referring now to FIG. 11, another preferred embodiment optical system 118 in accordance with the invention is generally shown. In the system 118, optical head 98, suspension 102 and gimbal system 104 are shown with an optical medium 120 which comprises an outer, protective overcoat layer 122, a first dielectric layer 124 adjacent outer layer 122, a read/write layer 110 of phase change or other writable material adjacent first dielectric layer 124, a second dielectric layer 126 adjacent read/write layer 110, a metal layer 128 adjacent second dielectric layer 126, a third dielectric layer 130 adjacent metal layer 128, and a base or substrate 108.

Read/write layer 110 preferably comprises a GeTeSb alloy as described above. Dielectric layers 124, 126 and 130 preferably comprise ZnS:SiO$_2$ as is well known in the art, which provides good heat resistance to protect other thermally sensitive layers from heat generated during writing. Dielectric layers 124, 126, 130 may alternatively comprise ZrO$_2$, Ta$_2$O$_2$, BN, Si$_3$N$_4$, AlN, TiN, ZnS, PbS, SiC, diamond-like carbon, or other materials with good heat resistance. Metal layer 128 preferably comprises Al, AlTi, or like Al alloy or other metal alloy. Outer protective layer 106 may comprise diamond-like carbon, C:H, C:N or like material, and substrate 108 may comprise a variety of glass, plastic or metal materials as described above.

The optical system 114 operates in generally the same manner as the system 96 described above and shown in FIG. 10, with the primary exception being the different structure of optical medium 120. The thickness of dielectric layer 124 contributes to optical path-length d between emission facet 48 and reflective surface 112 of read/write layer 110. During read/write operations, optical head 98 and optical medium 120 are positioned such that the emission facet 48 and the reflective surface 112 of optical medium 100 are separated by path-length d such that d is less than the output wavelength λ of laser 16 (d<λ), and, in one preferred embodiment, such that d is less than or equal to w/2.

Figure 12A:
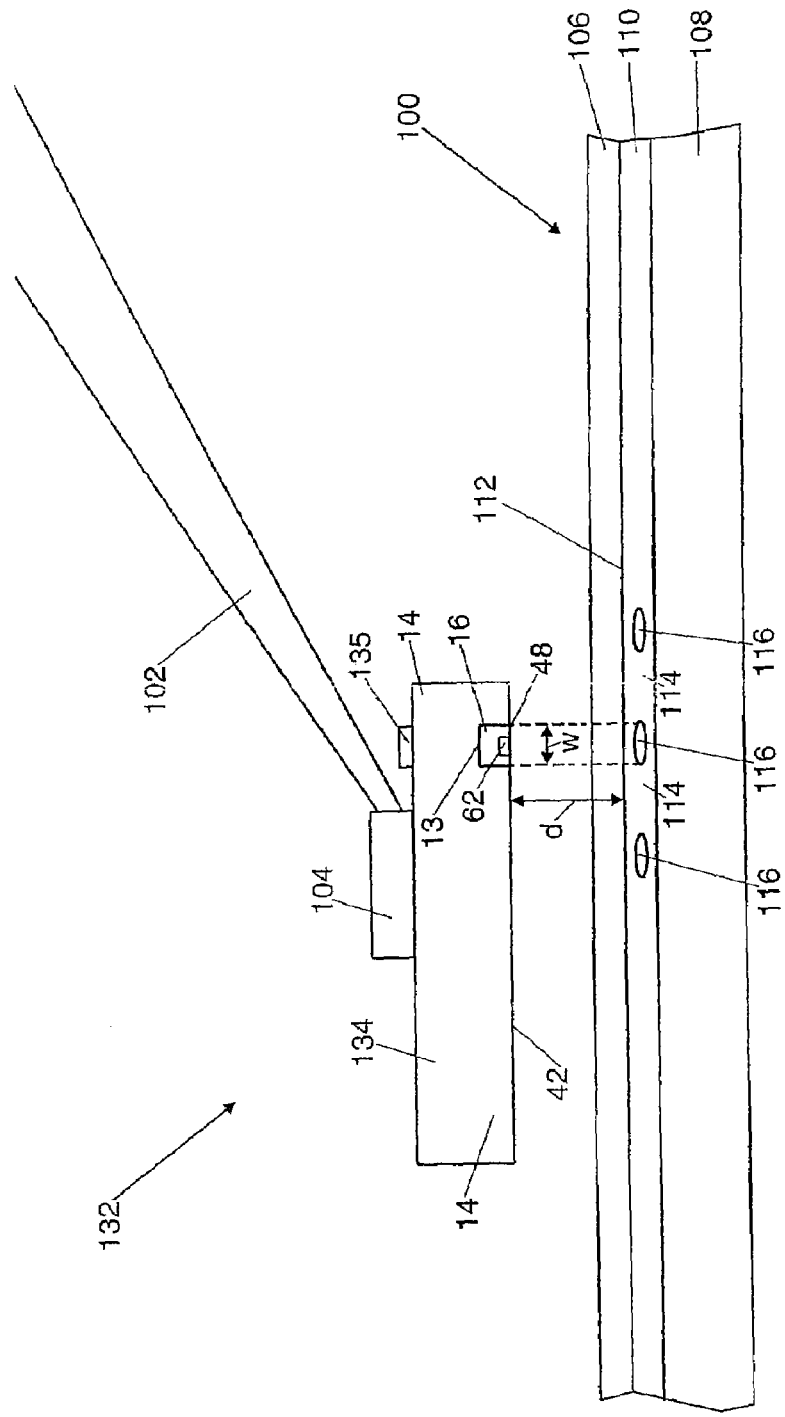
FIG. 12A and FIG. 12B are schematic side elevation views, in partial cross-section, of two related embodiments of near-field optical systems in accordance with the present invention wherein optical detection is used.

Referring now to FIG. 12A, yet another preferred embodiment near-field optical system 132 in accordance with the invention is shown, wherein like reference numbers are used to denote like parts. In the system 132, the optical medium 100 is shown with an optical head 134 mounted on arm 102 via suspension assembly 104. Medium 100, suspension 102 and gimbal mechanism 104 are the same as described above and shown in FIG. 10. Optical head 134 comprises a single, monolithic semiconductor substrate from which a slider region 14 and laser region 16 are defined in the manner described above. An optical detector 135 is mounted on optical head 134. Optical detector 135 may be of conventional structure and configuration, and is positioned to detect output from a rear facet 136 of laser 16. Readout of medium 100 is achieved by detection of output from rear facet 136 in a standard fashion. In other respects, the optical system 132 operates in generally the same manner as described above for optical system 96.

Figure 12B:
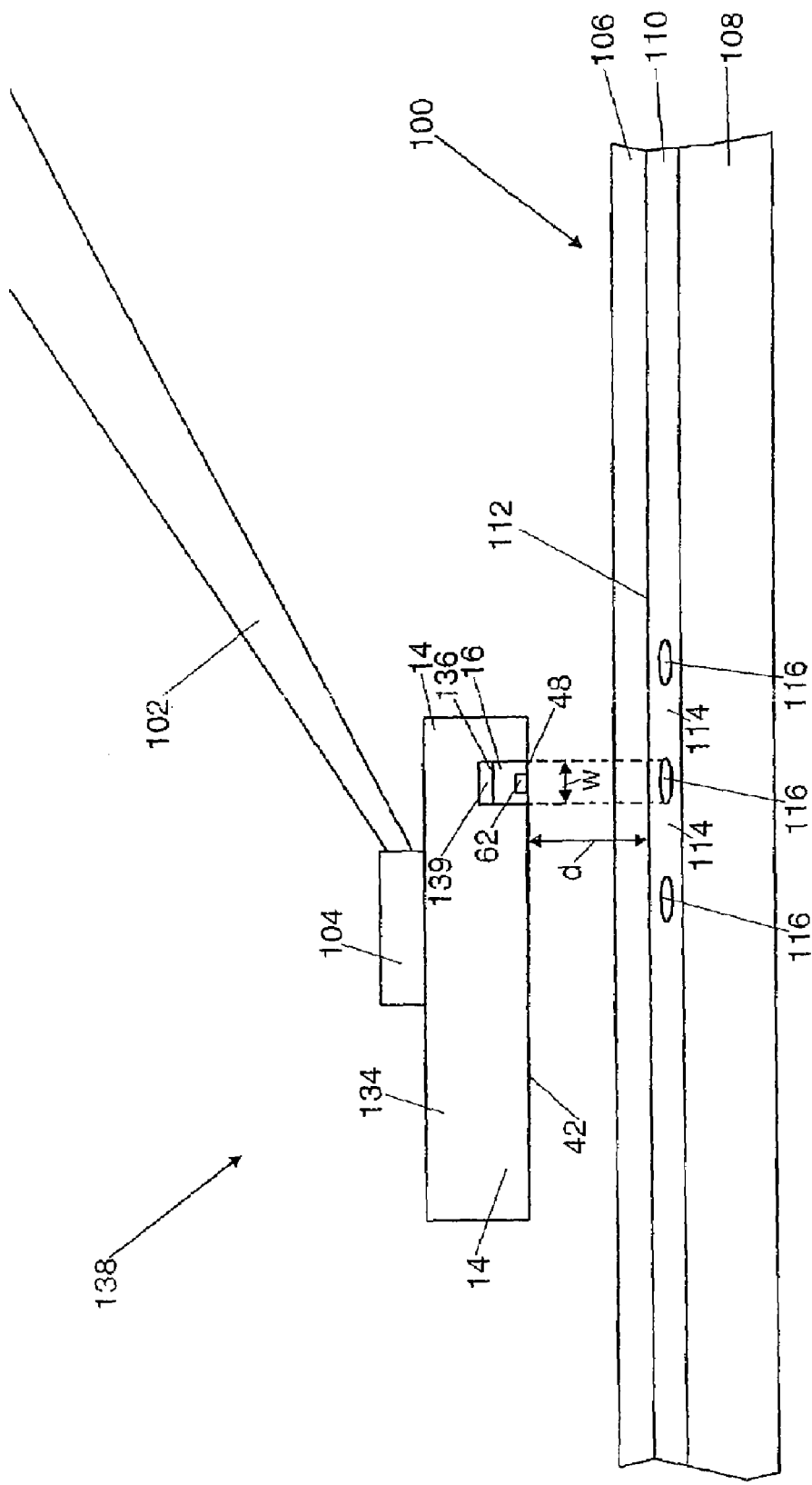

In FIG. 12B, a near-field optical system 138 is shown wherein a detector 139 is internal to optical head 134, and comprises an integral portion of the semiconductor substrate which makes up slider 14 and laser 16. In other words, detector, 139, laser 16 and slider 14 are integral portions of the same semiconductor substrate. Detector 139 is positioned adjacent to rear facet 136 to detect output from rear facet 136 in the manner described above. The optical system 138 otherwise operates in generally the same manner as described above for optical system 132.

Figure 13:
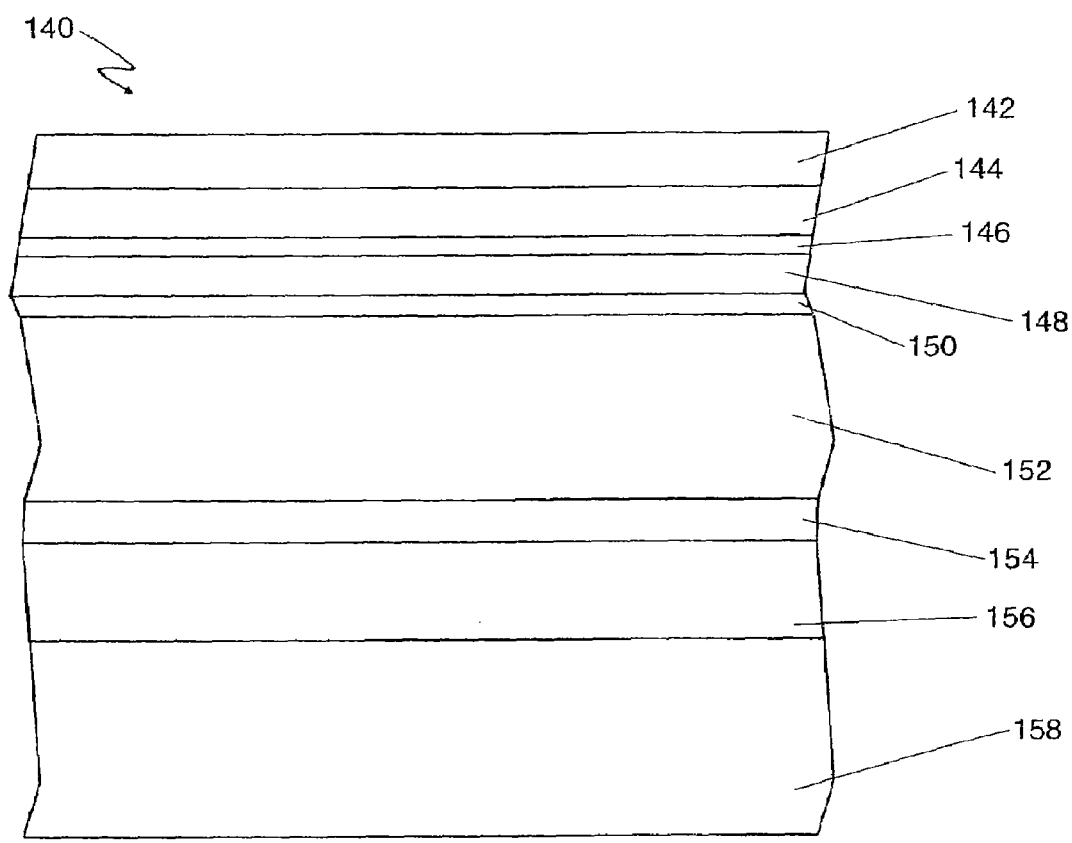
FIG. 13 is a schematic side elevation view in cross section of an alternative embodiment optical medium for use with the invention.

Referring now to FIG. 13, an alternative embodiment optical medium 140 in accordance with the invention is shown. Optical medium 140 comprises generally a lubricating overcoat layer 142, a first dielectric layer 144, a second dielectric layer 146, a phase change material layer 148, a third dielectric layer 150, a fourth dielectric layer 152, a metal layer 154, a fifth dielectric layer 156, and a base or substrate 158.

Overcoat layer 142 preferably comprises a low friction, low wear layer of fluorocarbon or like material. First dielectric layer 144 preferably comprises ZnS-SiO$_2$ as noted above, to provide a good thermal barrier, and also provide a mechanical barrier to resist volume expansion due to heating. Second dielectric layer 146 is an interface dielectric which may be selected for refractive index, adhesion promotion, internal stress, elastic modulus or other properties or considerations. Phase change layer 148 preferably comprises a GeTeSb alloy as described above. Third dielectric layer 150 is again an interface layer of a dielectric material selected for adhesion promotion, refractive index, or other properties as noted above. Fourth dielectric layer 152 preferably comprises ZnS-SiO$_2$, to provide a thermal barrier and resistance to thermally induced volume expansion. Metal layer 154 preferably comprises Al—Ti alloy. Fifth dielectric layer again preferably comprises ZnS-SiO$_2$ to provide a thermal barrier and resistance to thermal expansion. Substrate 158 preferably comprises a conventional glass.

The optical medium 140 is used with the near-field optical system of the invention in the manner described above for optical media 100 and 120.

Figure 14:
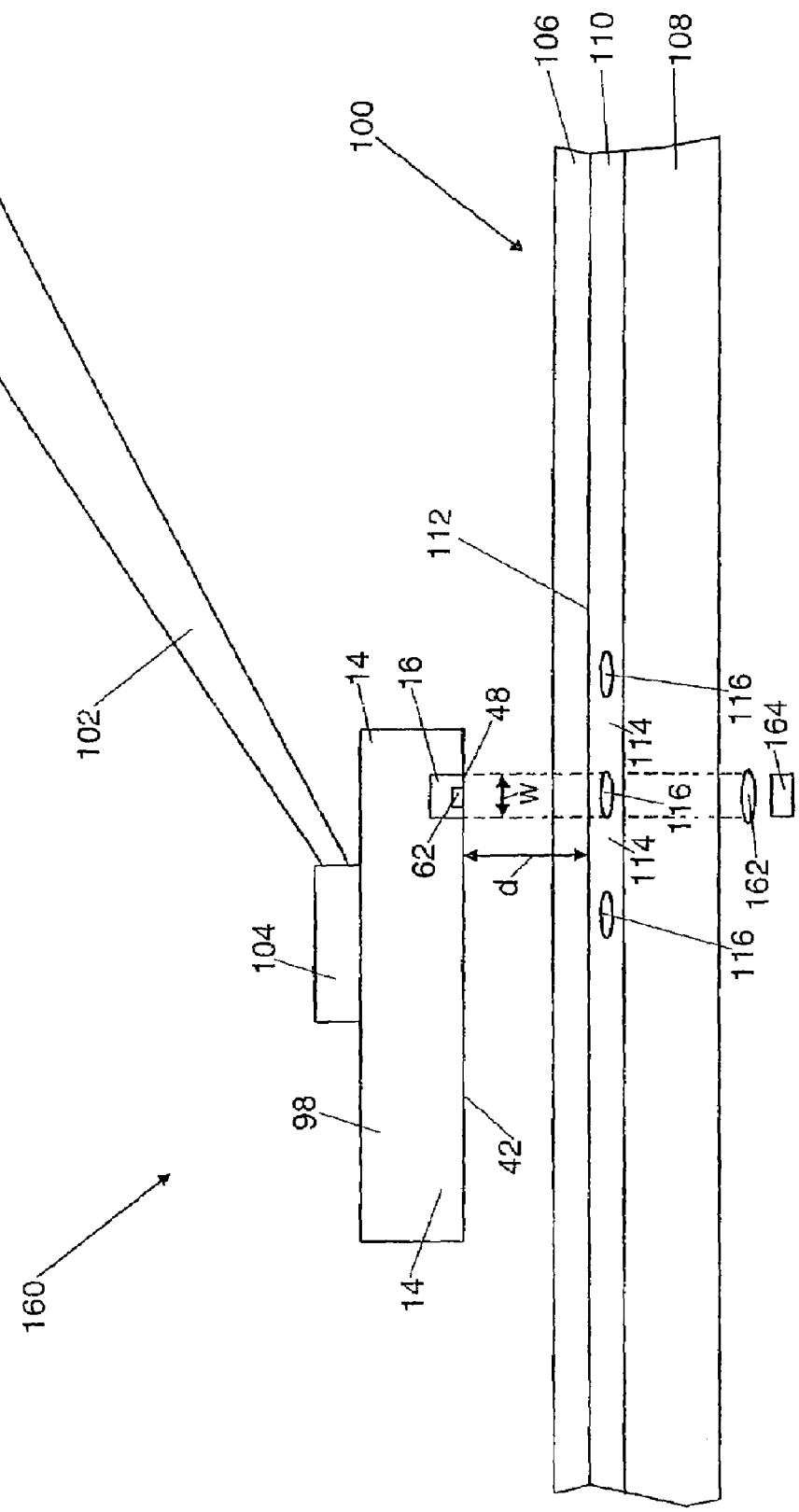
FIG. 14 is a schematic side elevation view, in partial cross section, of another preferred embodiment near-field optical system in accordance with the present invention wherein detection is carried out via transmission through the optical medium.

Referring to FIG. 14, there is shown another preferred embodiment near-field optical system 160 in accordance with the present invention, wherein like reference numbers are used to denote like parts. In the system 160, data detection is achieved through transmission, and a lens 162 and detector 164 are positioned on the opposite side of optical medium 100. Amorphous spots 116 and polycrystalline regions 114 have different transmissive properties, as noted above. Detector 164 and lens 162 are maintained in position with optical head 98 during readout, and changes in transmission through medium 100 are noted by detector 164 during readout. In other respects, the system 160 operates in generally the same manner as described above for near-field system 96.

Figure 15:
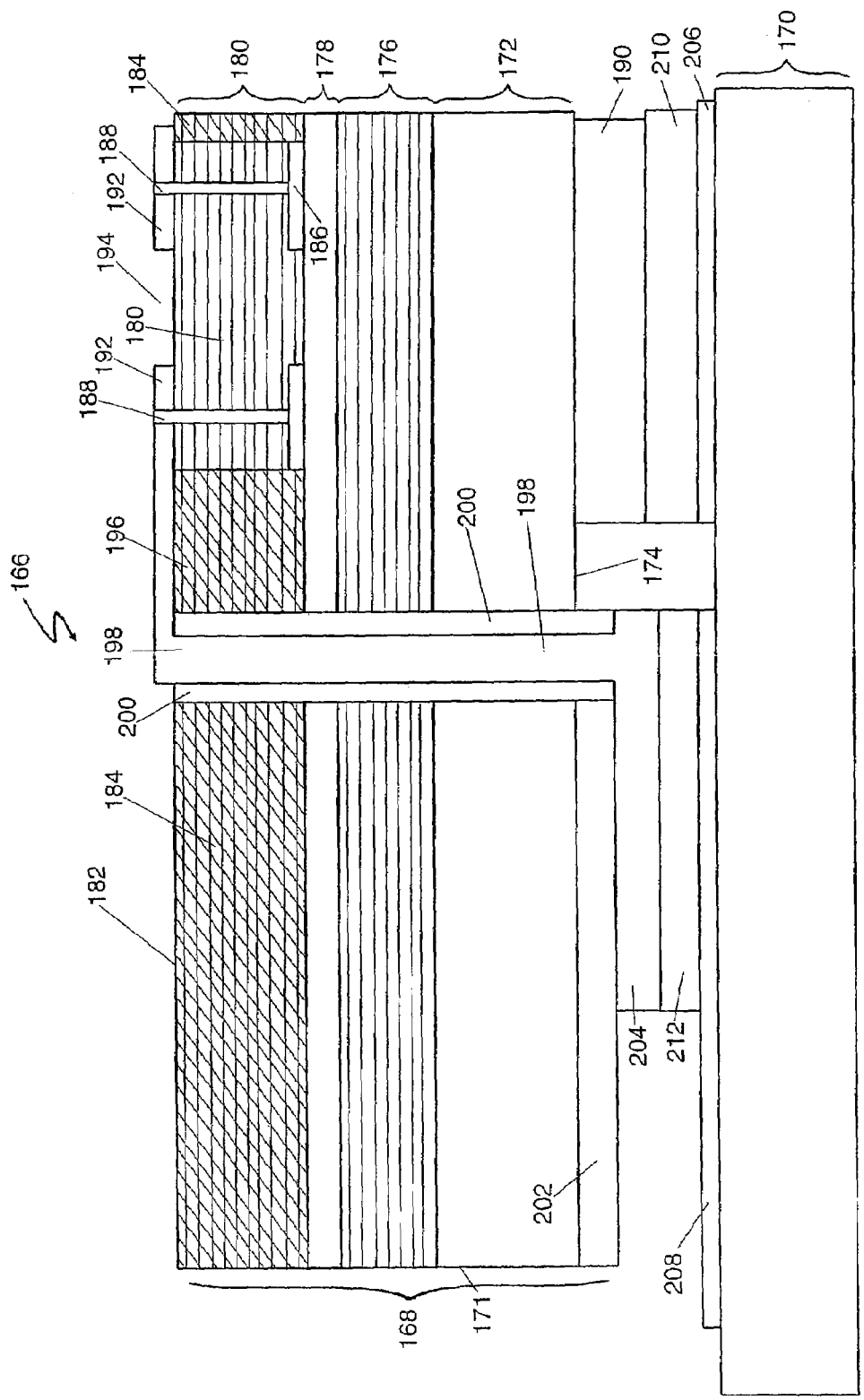
FIG. 15 is a schematic side elevation view, in partial cross-section, of a preferred embodiment semiconductor laser and circuit substrate in accordance with the present invention.

Referring now to FIG. 15, there is shown another aspect of the invention in the form of a semiconductor laser apparatus 166 comprising generally a semiconductor laser 168 and a circuit substrate 170. Semiconductor laser 168 comprises a semiconductor substrate 171 having a first conductivity-type base layer 172 adjacent a first side 174 of semiconductor substrate 168, a first conductivity-type clad layer 176, an active region layer 178, and a second conductivity-type clad layer 180 adjacent a second side 182 of semiconductor substrate 168. Preferably, the first conductivity-type is n-type and the second conductivity type is p-type, although this may be reversed in other embodiments of the invention.

Preferably, the first conductivity-type clad layer 176 comprises a plurality of first conductivity-type distributed Bragg reflector (DBR) quarter wave pairs, and the second conductivity-type clad layer 180 comprises a plurality of second conductivity-type distributed Bragg reflector (DBR) quarter wave pairs. In the apparatus 166, a substantial portion of the second conductivity-type clad layer has been ion implanted to define an ion implanted region 184 in the second conductivity-type clad layer 180. An oxidized or ion region is also provided in first conductivity-type clad layer 180. Oxidized region 186, together with ion implanted region 184, define generally the optical mode of semiconductor laser 168. A plurality of oxidation vias or channels 188 are shown in second conductivity-type clad layer 180, which allow oxidizing agents to penetrate into second conductivity-type clad layer 180 in order to form oxidized region 186. Oxidation in this manner allows more accurate control of the dimensions of oxidized region 186 than is provided by lateral oxidation methods. The use of channels for the formation of an oxide region is known in the art and is described more fully in U.S. Pat. No. 5,978,408.

A first side electrical contact 190 is deposited on first side 174 of substrate 171 adjacent first conductivity-type base layer 172, and second side electrical contact 192 is deposited on second side 182 of semiconductor substrate 171 adjacent second conductivity-type clad layer 180. First and second electrical contacts 190, 192 define a diode structure for laser 186. Second side electrical contact 192 also defines an emission facet 194 for laser 168.

First and second side electrical contacts 190, 192 are both accessible from a portion or portions of semiconductor laser 168 which are remote from second side 182 of laser 168. The term "remote" as used in this regard means generally opposite from, normal to, and/or not adjacent to, coplanar with, or otherwise associated second side 182. In the preferred embodiment, second sided electrical contact 192 is electrically coupled to a conductive bridge 196 and a conductive via 198 which extends through first conductivity-type base layer 172, first conductivity-type clad layer 176, active region layer 178, and second conductivity-type clad layer 180. An insulating layer 200 surrounds conductive via 198, and an insulating pad 202 is included on first side 174 of substrate 171. A conductive pad 204 is deposited on insulating pad 202, with conductive pad 204 being in electrical contact with conductive via 198, conductive bridge 196 and second side contact 192. In this manner, both second side electrical contact 192 and first side electrical contact 190 are electrically accessible from first side 174 of semiconductor laser 168. In an alternative embodiment, similar to that shown in FIG. 7, second side electrical contact 192 may be electrically coupled to a conductive pad on the side of semiconductor laser 168 which is generally normal to first and second sides 174, 182.

Circuit substrate 170 preferably comprises a silicon substrate having configured thereon CMOS circuitry or other circuitry (not shown) for controlling or driving laser 186. The nature of such CMOS circuitry for modulating the output of a semiconductor laser for encoding data is well know and need not be disclosed herein. Circuit substrate 170 includes interconnect wiring or conductors 206, 208, which are electrically coupled by solder or barrier metal contacts 210, 212 to first side contact 190 and conductive pad 204 respectively. As noted above, metal contact 204 is in electrical communication with second side contact 192 through conductive via 198 and bridge 196.

Figure 16:
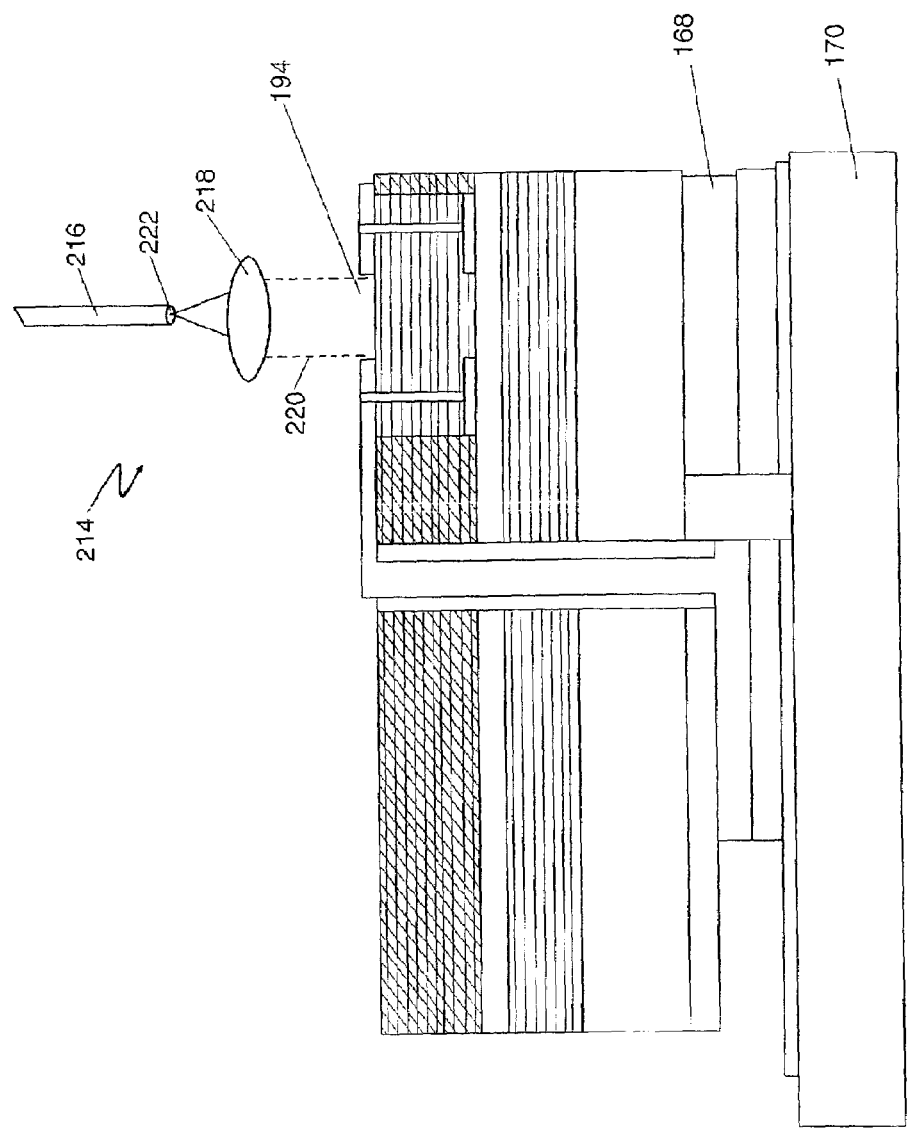
FIG. 16 is a schematic illustration of the semiconductor laser and circuit substrate of FIG. 15 shown with the laser emission facet coupled to an optical fiber via a lens.

Semiconductor laser 168 is shown as structured and configured for use with fiberoptic communication systems. In this regard, emission facet 194 does not necessarily include a small aperture as described above for near-field applications. Referring to FIG. 16, a fiberoptic communication system 214 is shown wherein semiconductor laser 168 is optically coupled to an optical fiber 216 through an objective lens 218 so that laser 168 can "launch" its output into optical fiber 216. As shown, the optical output 220 from emission facet 194 of laser 168 is directed to lens 218 and is focussed onto the end 222 of optical fiber 216.

Figure 17:
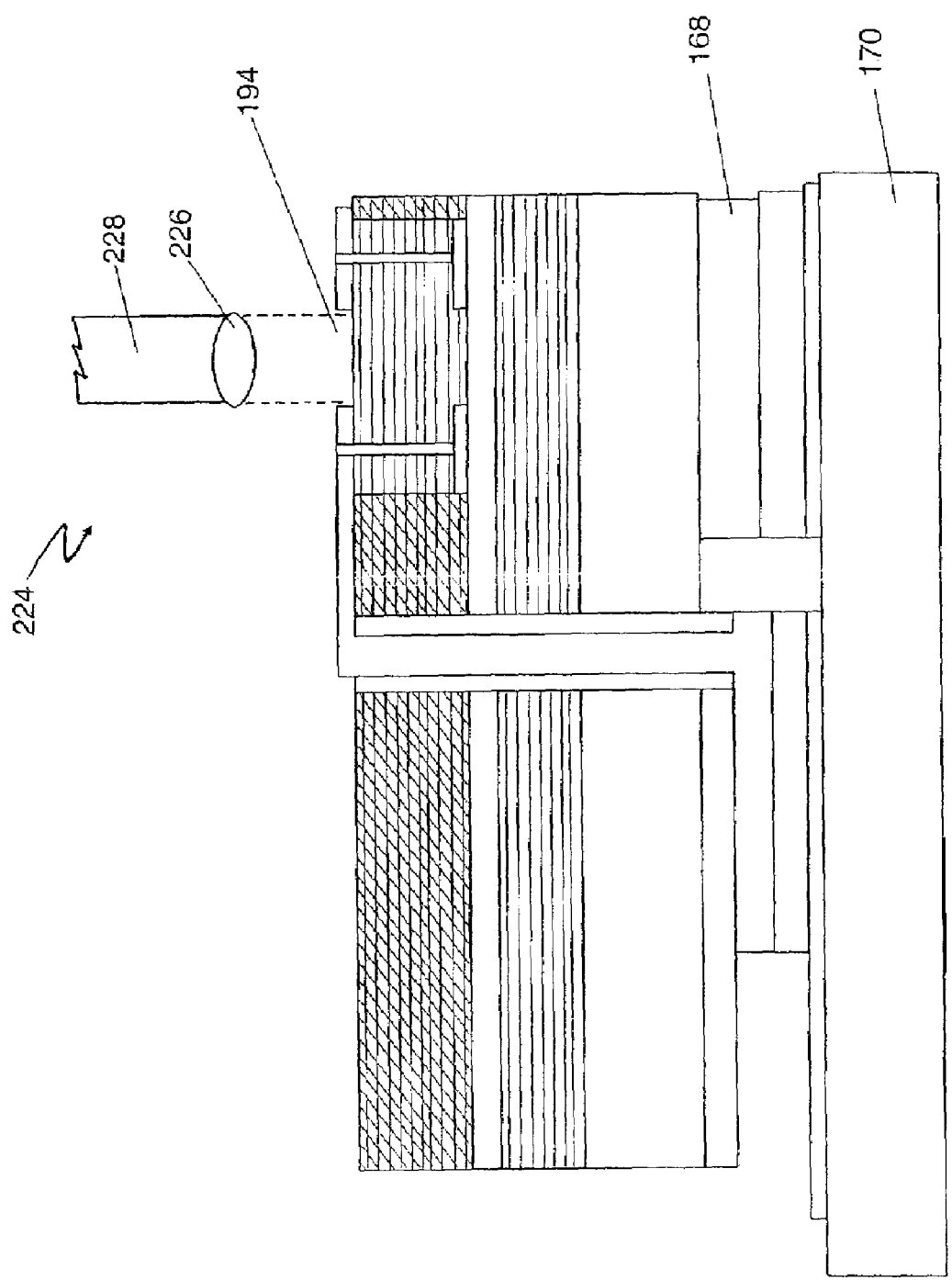
FIG. 17 is a schematic illustration of the semiconductor laser and circuit substrate of FIG. 15 shown with the laser emission facet coupled to an optical fiber directly at the laser emission facet.

In FIG. 17, an alternative embodiment fiberoptic communication system 224 is shown. In system 224, the end 226 of a multi-mode optical fiber 228 is positioned directly adjacent emission facet 194 for direct launching of optical output into fiber 228. While high quality, low loss, low dispersion single mode optical fibers are generally used for long distance optical communication, the system 224 of FIG. 17 is usable for applications with multi-mode fibers in local area fiber optic networks, including voice communication, data communication and storage area networks.

Accordingly, it will be seen that this invention provides an optical head apparatus and method wherein a solid state laser and slider comprise a single integrated, monolithic device fabricated from the same base semiconductor material into an optical head, and wherein a semiconductor laser apparatus associated with a CMOS circuit substrate for driving the laser via p- and n-side contacts which are electrically accessible from the n-side of the laser. Although the description above contains many specificities, these should not be construed as limiting the scope of the invention but as merely providing an illustration of the presently preferred embodiment of the invention. Thus the scope of this invention should be determined by the appended claims and their legal equivalents.

What is claimed is:

1. An apparatus comprising a single monolithic device including a slider, an air bearing surface, and at least one laser wherein the laser includes an aperture in an emission facet, the slider is adjacent to a p-clad layer, and the emission facet is substantially co-planar with the air bearing surface, the monolithic device being mounted on a read/write arms via a suspension mechanism, the device being used to read and write on an optical media.

2. The apparatus of claim 1 wherein a width "w" of the aperture is of smaller dimension than an output wavelength "λ" of the laser.

3. The apparatus of claim 2 wherein a reflective read/write surface of optical media during a read/write operation is positioned at an optical path-length "I" from the emission facet is less than the output wavelength "λ".

4. The apparatus of claim 1 wherein the optical media comprises "phase change" media.

5. The apparatus of claim 4 wherein the "phase change" media comprises GeTeSb materials.

6. The apparatus of claim 5 wherein the media comprise a phase change layer positioned between a protective overcoat and a base or substrate.

7. The apparatus of claim 1 wherein the optical media comprises an outer overcoat of a diamond-like carbon or protective material, a first dielectric layer, a phase change layer, a second dielectric layer, a metal layer, a third dielectric layer, and a base or substrate.

8. The apparatus of 7 wherein the dielectric layers comprises $ZnS:SiO_2$.

9. The apparatus of claim 1 wherein the laser further includes a p-electrical contact.

10. The apparatus of claim 9 wherein the p-electrical contact is recessed with respect to the emission facet.

11. The apparatus of claim 10 wherein the p-electrical contact and the p-clad layer are approximated to the emission facet.

12. The apparatus of claim 9 wherein the p-electrical contact is adjacent to the p-clad layer.

* * * * *